US008493762B2

(12) United States Patent
Ninomiya et al.

(10) Patent No.: US 8,493,762 B2
(45) Date of Patent: Jul. 23, 2013

(54) POWER SEMICONDUCTOR MODULE AND SEMICONDUCTOR POWER CONVERTER PROVIDED WITH THE SAME

(75) Inventors: Gou Ninomiya, Kawasaki (JP); Toshiharu Obu, Kawasaki (JP); Kazuhiro Ueda, Kawasaki (JP); Yoshiyuki Shimizu, Tokyo (JP); Shinichi Baba, Ichikawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 539 days.

(21) Appl. No.: 12/647,874

(22) Filed: Dec. 28, 2009

(65) Prior Publication Data

US 2011/0156797 A1    Jun. 30, 2011

(51) Int. Cl.
*H02M 7/5387* (2007.01)
*H05K 7/20* (2006.01)

(52) U.S. Cl.
USPC ........... 363/144; 363/132; 363/141; 361/715; 361/728

(58) Field of Classification Search
USPC .............. 363/95, 98, 132, 144, 146; 361/715, 361/728; 257/691, 712, 717
See application file for complete search history.

(56) References Cited

U.S. PATENT DOCUMENTS

| | | | | |
|---|---|---|---|---|
| 5,170,337 A * | 12/1992 | Borowiec et al. | ............. | 363/147 |
| 5,616,955 A * | 4/1997 | Yamada et al. | ................ | 257/690 |
| 5,726,466 A | 3/1998 | Nishitani | | |
| 5,896,286 A * | 4/1999 | Terasawa | ....................... | 363/132 |
| 6,954,368 B1 * | 10/2005 | Francoeur et al. | ............ | 363/144 |
| 7,504,720 B2 * | 3/2009 | Nakatsu et al. | ................ | 257/712 |
| 7,538,540 B2 * | 5/2009 | Tsukamoto | ............... | 324/117 R |
| 7,605,456 B2 | 10/2009 | Obu et al. | | |
| 7,633,758 B2 * | 12/2009 | Oohama | ........................ | 361/717 |
| 7,982,299 B2 * | 7/2011 | Watanabe | ...................... | 257/690 |
| 8,064,234 B2 * | 11/2011 | Tokuyama et al. | ........... | 363/141 |
| 2008/0290506 A1 | 11/2008 | Aoki et al. | | |

FOREIGN PATENT DOCUMENTS

| | | |
|---|---|---|
| DE | 298 23 619 U1 | 9/1999 |
| DE | 100 43 747 A1 | 3/2002 |
| EP | 1 768 243 A1 | 3/2007 |
| JP | 2007-12722 | 1/2007 |
| JP | 2007-68302 | 3/2007 |

OTHER PUBLICATIONS

O. Schilling, et al., "Properties of a New PrimePACK™ IGBT Module Concept for Optimized Electrical and Thermal Interconnection to a Modern Converter Environment", PCIM Europe 2005, Conference Proceedings, XP002595237, Jun. 7-9, 2005, pp. 449-454.
European Search Report issued Dec. 6, 2012 in Patent Application No. 09 180 967.3.

* cited by examiner

*Primary Examiner* — Gary L Laxton
(74) *Attorney, Agent, or Firm* — Oblon, Spivak, McClelland, Maier & Neustadt, L.L.P.

(57) ABSTRACT

A power semiconductor module includes semiconductor elements of a first system constituting each of arms in a circuit of the first system, semiconductor elements of a second system constituting each of arms in a circuit of the second system, a plurality of DC electrode conductors including a common DC electrode conductor joined to the semiconductor elements of the first and second systems, and a plurality of AC electrode conductors joined to the respective semiconductor elements of the first and second systems. Each of the semiconductor elements of the first and second systems is interposed between the DC electrode conductor and AC electrode conductor.

17 Claims, 12 Drawing Sheets

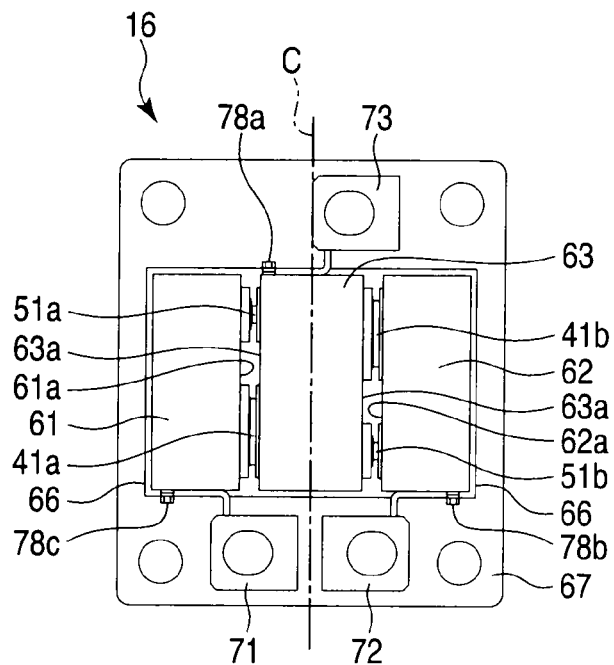
F I G. 14
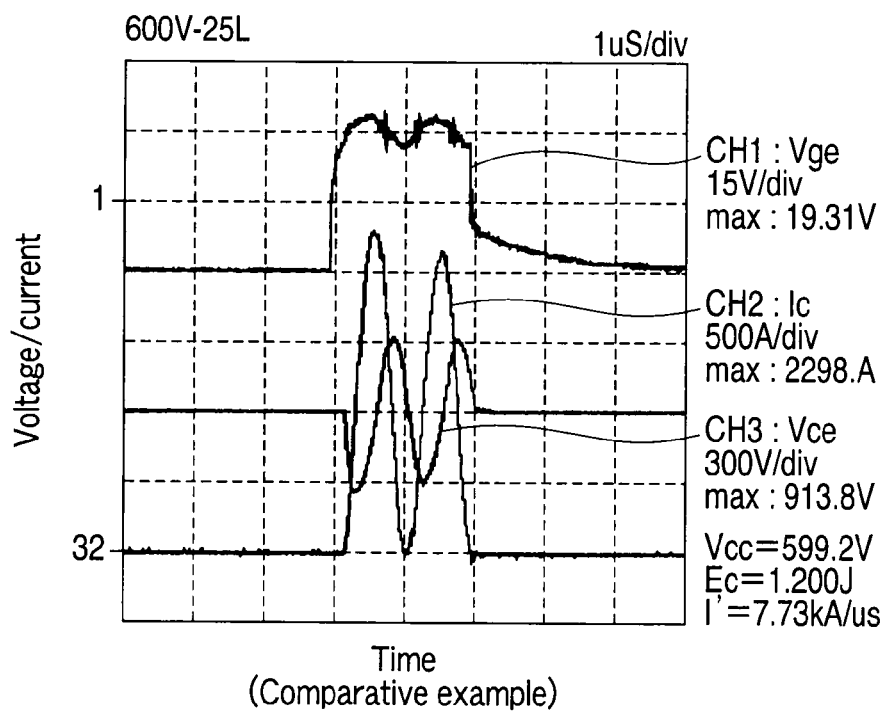
F I G. 15

POWER SEMICONDUCTOR MODULE AND SEMICONDUCTOR POWER CONVERTER PROVIDED WITH THE SAME

BACKGROUND OF THE INVENTION

1. Field of the Invention

The present invention relates to a power semiconductor module and semiconductor power converter provided with the power semiconductor module.

2. Description of the Related Art

In general, an electric vehicle or hybrid car is provided with an inverter device as a semiconductor power converter configured to convert DC power to AC power and supply the AC power to a motor. For example, a three-phase inverter device includes three power semiconductor modules corresponding to the U-phase, V-phase, and W-phase. In such an onboard semiconductor power converter, downsizing, cost reduction, and improvement in cooling efficiency are indispensable. In order to achieve such an object, downsizing, cost reduction and improvement in cooling efficiency of the power semiconductor module which is a main component of the semiconductor power converter become important.

According to a semiconductor power converter disclosed in, for example, Jpn. Pat. Appln. KOKAI Publication No. 2007-68302, a power semiconductor module is provided with a first conductor, second conductor, and third conductor each of which is formed of a conductive metal, and a radiator including a joint surface joined to these conductors. The positive electrode side of an insulated gate bipolar transistor (IGBT) and diode which are semiconductor elements constituting an upper arm of one phase is joined to the first conductor. The negative electrode side of an IGBT and diode each constituting a lower arm of the one phase is joined to the second conductor. Further, the third conductor is arranged between the first conductor and second conductor, and is joined to the negative electrode side of an IGBT and diode each constituting the upper arm, and the positive electrode side of an IGBT and diode each constituting the lower arm. The first conductor and second conductor function as a positive electrode, and negative electrode, respectively, and third conductor functions as an AC output electrode. Each IGBT is provided with a plurality of input/output terminals such as an emitter sense terminal.

Further, each of the first to third conductors is arranged on a radiator in such a manner that joint surfaces at which the conductors are joined to the semiconductor elements are not parallel with the joint surface between the radiator and the conductors. By virtue of the configuration described above, there is provided a power semiconductor module and semiconductor power converter in each of which cooling efficiency and manufacturability are improved.

The three-phase semiconductor power converter configured in the manner described above includes one power semiconductor module for each phase, i.e., three power semiconductor modules in all. When such a semiconductor power converter is used in a two-motor hybrid system provide with two motors, in total six power semiconductor modules, i.e., three power semiconductor modules used for one motor, and three power semiconductor modules used for the other motor are required. For this reason, the footprint of the power semiconductor modules is large, this being an obstacle in the downsizing of the overall device. Further, the thermal resistance of the semiconductor power converter is large as a whole, and improvement in the cooling ability is desired.

The plurality of IGBTs calorific values of which are each larger than that of the diode are arranged to face each other with the third conductor interposed between the IGBTs. In this case, heat components conducted from both the IGBTs to the third conductor interfere each other, whereby heat is liable to be accumulated in the third conductor. As a result of this, the thermal resistance of the semiconductor element is made high, and the improvement in the cooling efficiency of the power semiconductor module is lowered.

Further, in the power semiconductor module configured as described above, both the electrode surfaces of the switching element such as the IGBT are joined to the conductor, and emitter sense terminals are provided to the switching elements. In this case, the emitter sense position is in the vicinity of the emitter electrode surface of the switching element, and the inductance on the emitter side becomes substantially zero. As a result of this, when the switching element is driven, a phenomenon in which the current and voltage of the switching element vibrate occurs. When such vibration of the current and voltage occurs, it becomes difficult to stably drive a motor and the like by using the power semiconductor module.

BRIEF SUMMARY OF THE INVENTION

The present invention has been contrived in view of these circumstances, and its object is to provide a power semiconductor module, and semiconductor power converter which can be further reduced in size, and in which the cooling efficiency can be further improved.

According to an aspect of the invention, there is provided a power semiconductor module comprising: semiconductor elements of a first system constituting each of arms in a circuit of the first system; semiconductor elements of a second system constituting each of arms in a circuit of the second system; a plurality of DC electrode conductors including a common DC electrode conductor joined to the semiconductor elements of the first and second systems; and a plurality of AC electrode conductors joined to the respective semiconductor elements of the first and second systems, each of the semiconductor elements of the first and second systems being interposed between the DC electrode conductor and AC electrode conductor.

According to another aspect of the invention, there is provided a power semiconductor module comprising: a first semiconductor element constituting an upper arm of one phase in a circuit of a first system; a second semiconductor element constituting a lower arm of the one phase in the circuit of the first system; a third semiconductor element constituting an upper arm of one phase in a circuit of a second system; a fourth semiconductor element constituting a lower arm of the one phase in the circuit of the second system; a first conductor joined to a positive electrode side of the first semiconductor element, and positive electrode side of the third semiconductor element; a second conductor joined to a negative electrode side of the second semiconductor element, and negative electrode side of the fourth semiconductor elements; a third conductor arranged between the first conductor and the second conductor, and joined to a negative electrode side of the first semiconductor element, and positive electrode side of the second semiconductor element; and a fourth conductor arranged between the first conductor and second conductor, and joined to a negative electrode side of the third semiconductor elements, and positive electrode side of the fourth semiconductor element.

According to still another aspect of the invention, there is provided a semiconductor power converter comprising: the power semiconductor module mentioned above; a drive circuit configured to drive the power semiconductor module; and a control circuit configured to control the power semiconductor module.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 14 is a plan view showing the power semiconductor module;

FIG. 15 is a graph showing the current/voltage characteristics of a switching element of a power semiconductor module according to a comparative example;

DETAILED DESCRIPTION OF THE INVENTION

Semiconductor power converters according to embodiments of the present invention will be described in detail with referring to the accompanying drawings.

Figure 1:
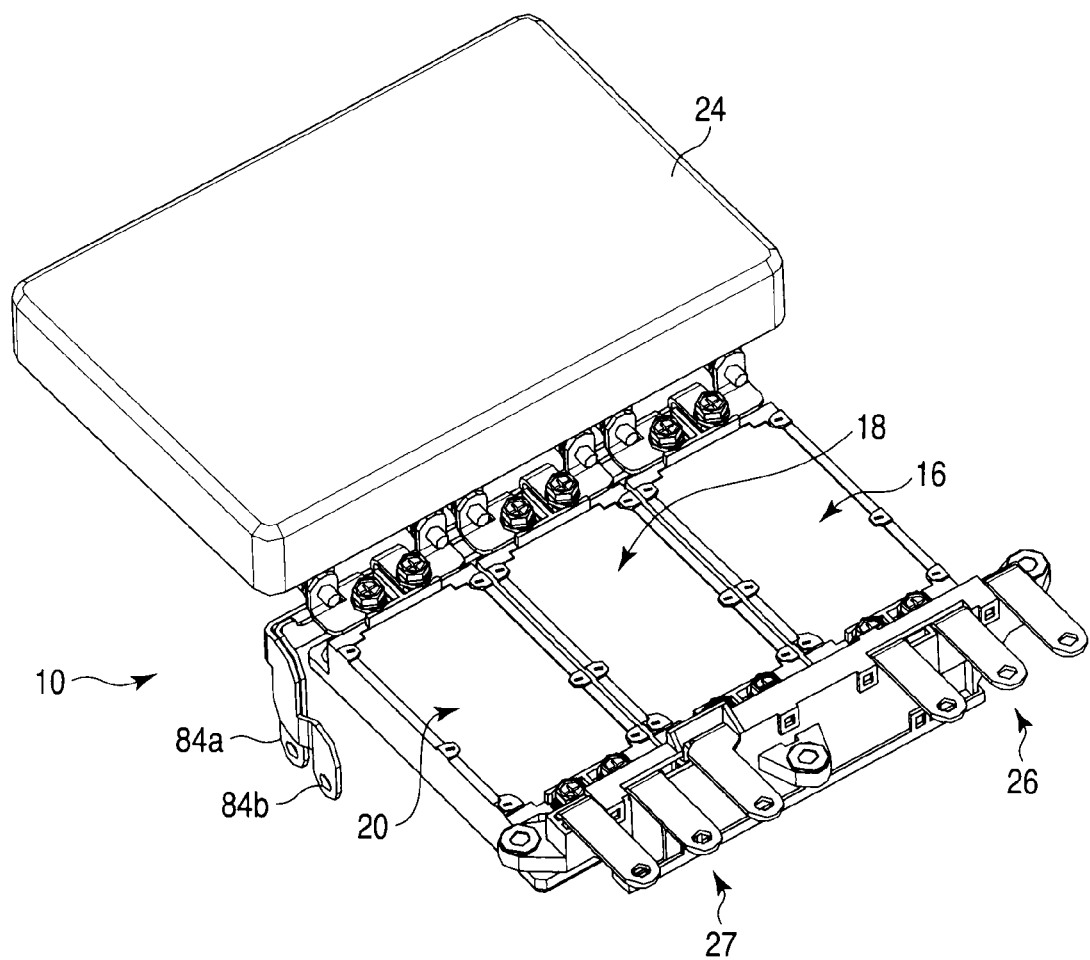
FIG. 1 is a perspective view showing an inverter device according to a first embodiment of the present invention.
Figure 2:
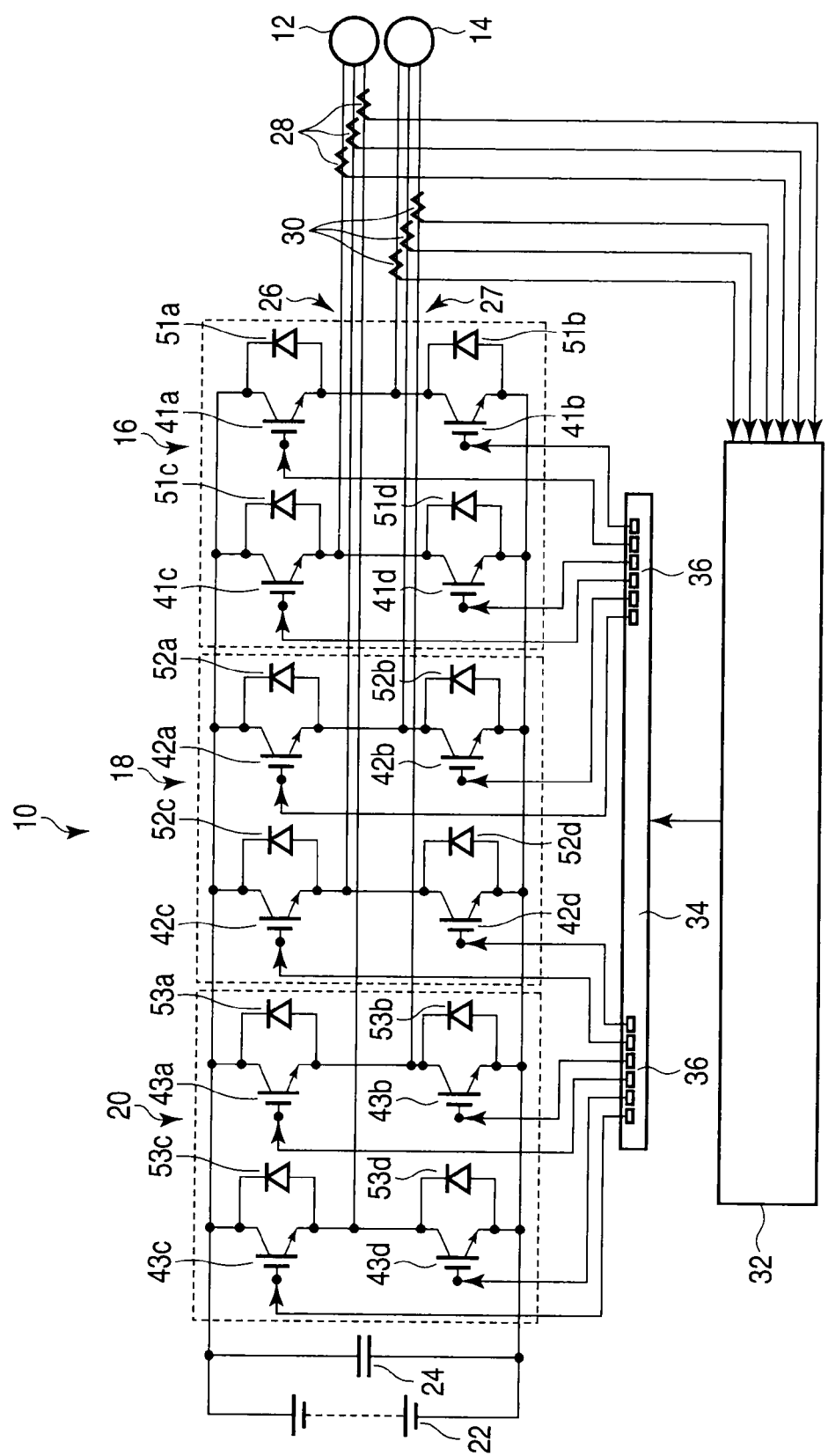
FIG. 2 is an equivalent circuit diagram of the inverter device.

FIG. 1 is a perspective view showing an inverter device provided with power semiconductor modules according to an embodiment as a semiconductor power converter, and FIG. 2 shows an equivalent circuit of the inverter device. As shown in FIGS. 1 and 2, the inverter device 10 is configured as a three-phase inverter of the U-phase, V-phase, and W-phase and, at the same time, is configured to supply power to, for example, a first motor 12, and second motor 14 as the objective load. The inverter device 10 is provided with an inverter circuit of a first system configured to supply power to the first motor 12, and inverter circuit of a second system configured to supply power to the second motor 14, the inverter circuits being in one united body.

The inverter device 10 is provided with three power semiconductor modules 16, 18, and 20 corresponding to the U-phase, V-phase, and W-phase, a smoothing capacitor 24 configured to smooth a DC voltage to be supplied from a DC power source, for example, a battery 22 to the power semiconductor modules, current detectors 28 and 30 configured to detect a current flowing to the first or second motor through a three-phase output connection conductor 26 or 27, a control unit 32 configured to control the power semiconductor modules 16, 18, and 20 on the basis of information on the currents detected by the current detectors, a voltage applied to the smoothing capacitor 24, and the like, and a drive circuit board 34 including a drive circuit configured to drive a gate of a semiconductor element of a power semiconductor module to be described later. The drive circuit board 34 is provided with drive ICs 36 configured to drive semiconductor elements in a one-to-one correspondence with the semiconductor elements. That is, in this circuit, twelve drive ICs 36 are provided. Further, beneath the power semiconductor modules 16, 18, and 20, and smoothing capacitor 24, a radiator (not shown) such as a heat sink or the like configured to cool these members is provided.

The power semiconductor modules 16, 18, and 20 will be described below in detail. Each of the power semiconductor modules 16, 18, and 20 is configured in the same manner, and hence the power semiconductor module 16 will be described below as a representative.

Figure 3:
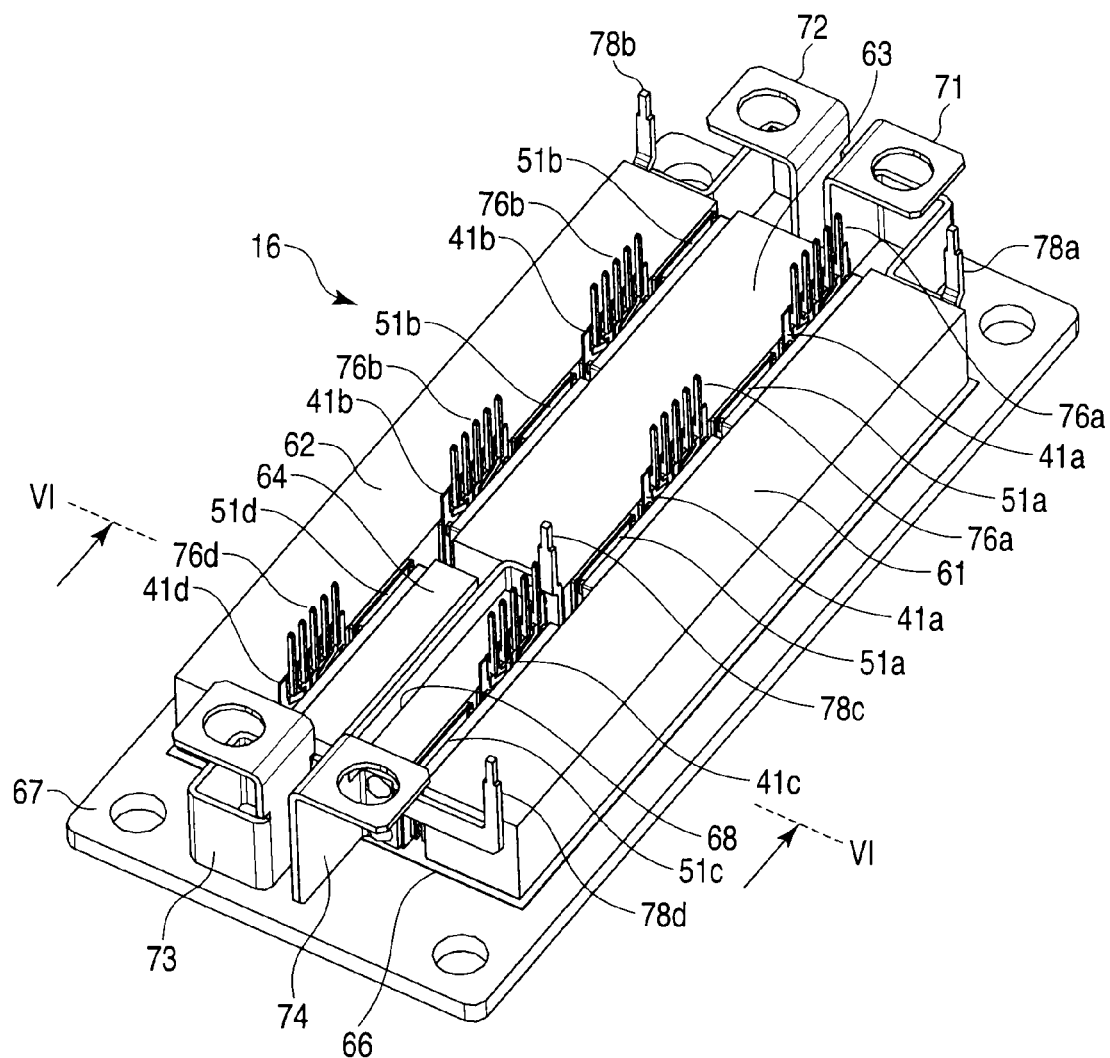
FIG. 3 is a perspective view showing a power semiconductor module of the inverter device with the cover thereof removed.
Figure 4:
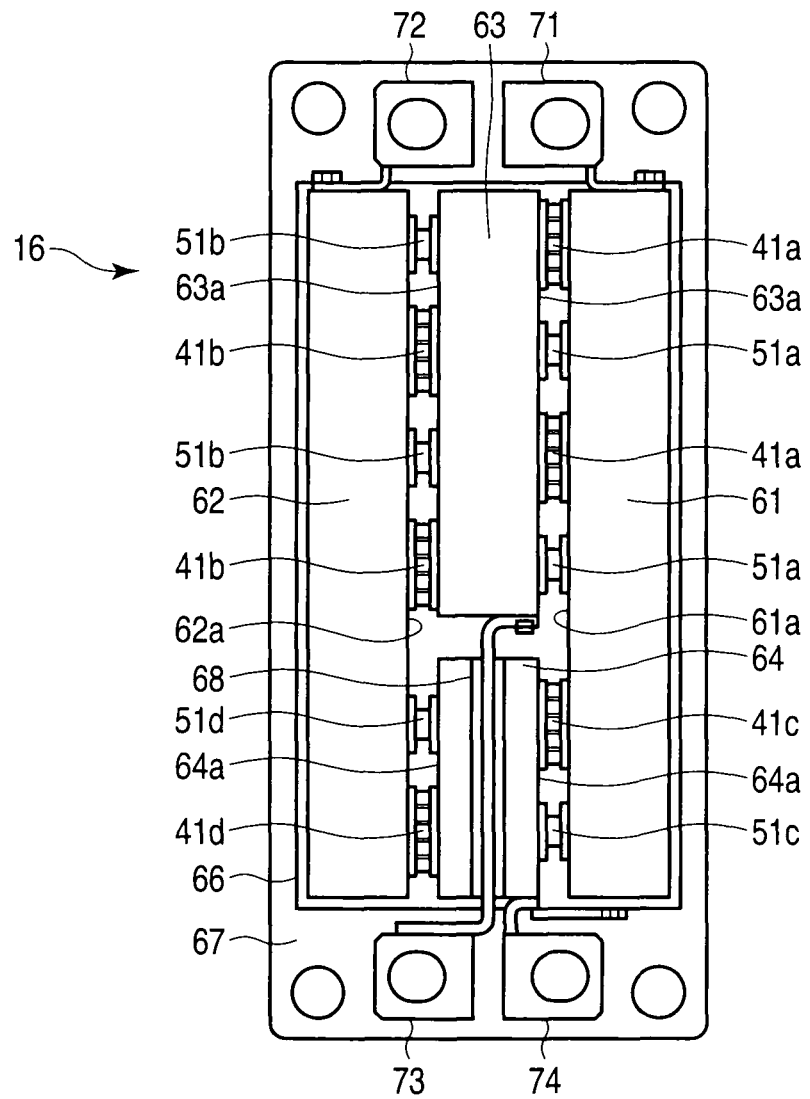
FIG. 4 is a plan view showing the power semiconductor module.
Figure 5:
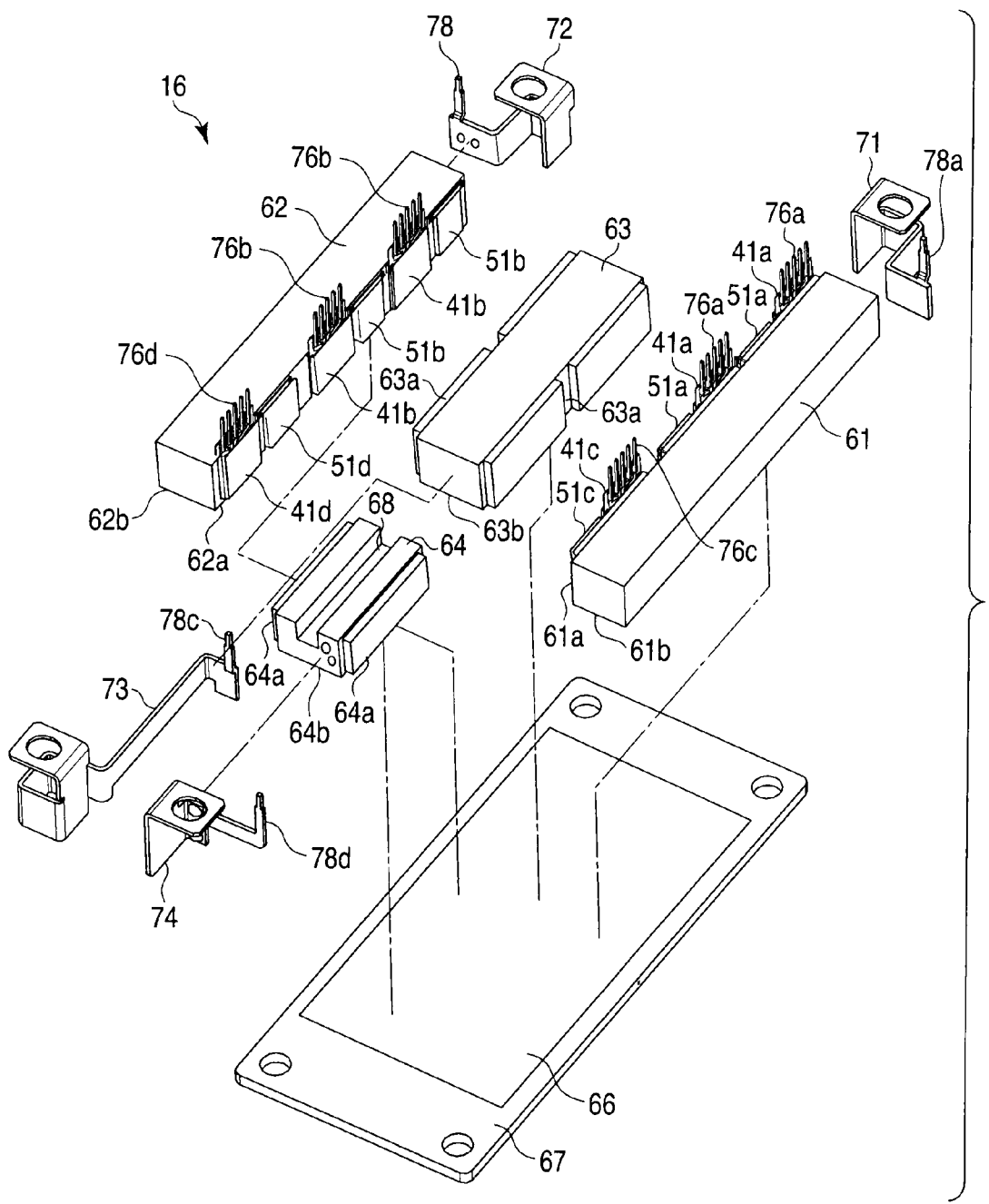
FIG. 5 is an exploded perspective view of the power semiconductor module.
Figure 6:
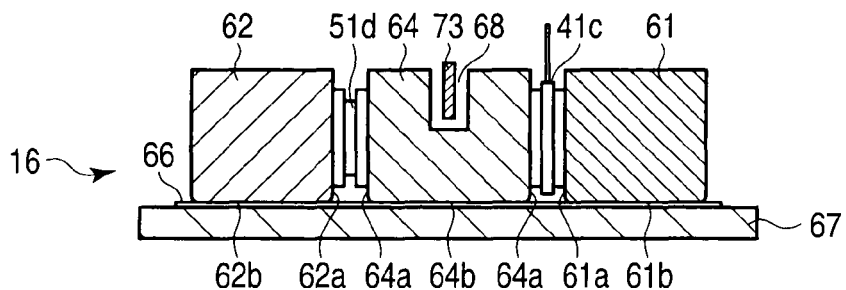
FIG. 6 is a cross-sectional view of the power semiconductor module taken along line VI-VI in FIG. 3.

FIG. 3 is a perspective view showing the power semiconductor module 16 in a state where the cover thereof is removed, FIG. 4 is a plan view of the power semiconductor module, FIG. 5 is a perspective view showing the power semiconductor module in an exploding manner, and FIG. 6 is a cross-sectional view of the power semiconductor module taken along line VI-VI in FIG. 3.

As shown in FIGS. 2 to 5, the power semiconductor module 16 is provided with first semiconductor elements constituting an upper arm of the U-phase in the inverter circuit of the first system, i.e., an IGBT 41$a$ serving as a switching element, and diode 51$a$ in this case, IGBT 41$b$ and diode 51$b$ functioning as second semiconductor elements constituting a lower arm of the U-phase in the inverter circuit of the first system, IGBT 41$c$ and diode 51$c$ functioning as third semiconductor elements constituting an upper arm of the U-phase in the inverter circuit of the second system, IGBT 41$d$ and diode 51$d$ functioning as fourth semiconductor elements constituting a lower arm of the U-phase in the inverter circuit of the second system, first conductor 61, second conductor 62, third conductor 63, fourth conductor 64, sheet-like insulator 66, and radiator plate 67 functioning as a base.

The IGBTs 41a, 41b, 41c, and 41d, and diodes 51a, 51b, 51c, and 51d are semiconductor chips with a size of, for example, about 10 mm square. The diodes 51a, 51b, 51c, and 51d are connected in inversely parallel to the IGBTs 41a, 41b, 41c, and 41d, respectively. In this embodiment, as for the IGBT 41a constituting the upper arm of the U-phase in the inverter circuit of the first system, two parallel-connected IGBTs 41a are provided and, as for diode 51a too, two diodes 51a are connected in parallel with each other. Likewise, as for the IGBT 41b constituting the lower arm of the U-phase in the inverter circuit of the first system, two parallel-connected IGBTs 41b are provided and, as for the diode 51b too, two diodes 51b are connected in parallel with each other.

Each of the first, second, third, and fourth conductors 61, 62, 63, and 64 is formed of a conductive metal into a long and thin rod-like shape with both end parts in the axial direction, for example, a rectangular column-like shape. The first conductor 61 and second conductor 62 are formed into the same length, and the third conductor 63 and fourth conductor 63 and 64 are formed in such a manner that each of the third conductor and fourth conductor is shorter than the length of the first conductor 61 or second conductor 62, and the sum of the lengths of the third conductor and fourth conductor is slightly shorter than the length of the first or second conductor. The first, second, third, and fourth conductors 61, 62, 63, and 64 are formed into substantially the same width.

One side surface of the first conductor 61 forms a first joint surface 61a, and the other side surface perpendicular to this side surface forms a second joint surface 61b. The first joint surface 61a of the first conductor 61 is electrically and mechanically joined to the positive electrode side (collectors and cathodes, respectively) of the IGBTs 41a and diodes 51a each constituting the upper arm of the first system. Further, the first joint surface 61a of the first conductor 61 is electrically and mechanically joined to the positive electrode side (collector and cathode, respectively) of the IGBT 41c and diode 51c each constituting the upper arm of the second system. As a result of this, the first conductor 61 constitutes a DC positive electrode conductor to be shared by the semiconductor elements of the first system and second system.

On the first joint surface 61a, the IGBTs 41a, diodes 51a, IGBT 41c, and diode 51c are arranged in a line along substantially the entire length of the first conductor 61 in the longitudinal direction thereof, and further the IGBTs and diodes are alternately arranged.

One side surface of the second conductor 62 forms a first joint surface 62a, and the other side surface perpendicular to this side surface forms a second joint surface 62b. The first joint surface 62a of the second conductor 62 is joined to the negative electrode side (emitters, and anodes, respectively) of the IGBTs 41b and diodes 51b each constituting the lower arm of the first system, and the second conductor 62 is electrically and mechanically connected to the electrodes of the IGBTs 41b and diodes 51b on the negative electrode side. Further, the first joint surface 62a of the second conductor 62 is joined to the negative electrode side (an emitter, and anode, respectively) of the IGBT 41d and diode 51d each constituting the lower arm of the second system, and the second conductor 62 is electrically and mechanically connected to the electrodes of the IGBT 41d and diode 51d on the negative electrode side. As a result of this, the second conductor 62 constitutes a DC negative electrode conductor to be shared by the first system and second system.

On the first joint surface 62a, the IGBTs 41b, diodes 51b, IGBT 41d, and diode 51d are arranged in a line along substantially the entire length of the second conductor 62 in the longitudinal direction thereof, and further IGBTs and diodes are alternately arranged.

The second conductor 62 is arranged in parallel with the first conductor 61 with a gap held between them. Further, the first joint surface 61a of the first conductor 61 and first joint surface 62a of the second conductor 62 face each other in parallel with each other with a gap held between them. The second joint surface 61b of the first conductor 61, and second joint surface 62b of the second conductor 62 are positioned flush with each other on the same plane.

The IGBTs 41a and 41c joined to the first conductor 61 are arranged at positions on the first conductor shifted in the longitudinal direction thereof with respect to the IGBTs 41b and 41d joined to the second conductor 62, and are arranged to face the diodes 51b and 51d joined to the second conductor 62 without facing the IGBTs 41b and 41d. Likewise, the IGBTs 41b and 41d joined to the second conductor 62 are arranged to face the diodes 51a and 51c joined to the first conductor 61. In other words, as can be seen well from FIGS. 3 and 4, the IGBTs 41a and 41c joined to the first conductor 61, and IGBTs 41b and 41d joined to the second conductor 62 are arranged staggered with respect to the first and second conductors 61 and 62.

As shown in FIGS. 3 to 6, the third conductor 63 is arranged between the first conductor 61 and second conductor 62 with gaps held between them. The third conductor 63 is arranged in such a manner that one end part thereof in the axial direction is aligned with end parts of the first and second conductors 61 and 62 in the axial direction. Two side surfaces of the third conductor 63 opposed to each other form two first joint surfaces 63a, and these two first joint surfaces 63a are opposed to the first joint surface 61a of the first conductor 61, and first joint surface 62a of the second conductor 62 in parallel with each other. Further, the other side surface perpendicular to the above two side surfaces of the third conductor 63 forms a second joint surface 63b. The second joint surface 63b is positioned flush with the second joint surfaces 61b and 62b of the first and second conductors 61 and 62 on the same plane.

The one first joint surface 63a of the third conductor 63 is joined to the negative electrode side (emitters, and anodes, respectively) of the IGBTs 41a and diodes 51a each constituting the upper arm of the first system, and the third conductor 63 is electrically and mechanically connected to the electrodes of the IGBTs 41a and diodes 51a on the negative electrode side. The other first joint surface 63a of the third conductor 63 is joined to the positive electrode side (collectors, and cathodes, respectively) of the IGBTs 41b and diodes 51b each constituting the lower arm of the first system, and the third conductor 63 is electrically and mechanically connected to the electrodes of the IGBTs 41b and diodes 51b on the positive electrode side. As a result of this, the third conductor 63 constitutes an AC electrode (output electrode) conductor of the first system.

The fourth conductor 64 is arranged between the first conductor 61 and second conductor 62 with gaps held between them, and is further arranged in line with the third conductor 63 with a gap held between the conductor 64 and the third conductor 63. One end part of the fourth conductor 64 in the axial direction is opposed to one end part of the third conductor 63 with the gap held between them, and the other end part thereof in the axial direction is arranged in alignment with the other end parts of the first and second conductors 61 and 62 in the axial direction.

Two side surfaces of the fourth conductor 64 opposed to each other form two first joint surfaces 64a, and these first joint surfaces 64a are opposed to the first joint surface 61a of the first conductor 61, and first joint surface 62a of the second conductor 62 in parallel with each other. Further, the other side surface of the fourth conductor 64 perpendicular to the above two side surfaces thereof forms a second joint surface 64b. The second joint surface 64b is positioned flush with the second joint surfaces 61b and 62b of the first and second conductors 61 and 62 on the same plane.

The one joint surface 64a of the fourth conductor 64 is joined to the negative electrode side (an emitter, and anode, respectively) of the IGBT 41c and diode 51c each constituting the upper arm of the second system, and the fourth conductor 64 is electrically and mechanically connected to the electrodes of the IGBT 41c and diode 51c on the negative electrode side. The other first joint surface 64a of the fourth conductor 64 is joined to the positive electrode side (a collector, and cathode, respectively) of the IGBT 41d and diode 51d each constituting the lower arm of the second system, and the fourth conductor 64 is electrically and mechanically connected to the electrodes of the IGBT 41b and diode 51b on the positive electrode side. As a result of this, the fourth conductor 64 constitutes an AC electrode (output electrode) conductor of the second system.

In a top surface of the fourth conductor 64, i.e., in a side surface thereof positioned on the opposite side of the second joint surface 64b in this case, a groove-like notch 68 is formed. This notch 68 extends from one end to the other end in the axial direction of the fourth conductor 64.

It should be noted that the joint between the joint surfaces of the respective conductors and IGBTs and diodes can be carried out by soldering or by using a conductive adhesive. Alternatively, these members may be joined to each other through a thermal shock plate. It is desirable that the material of the first to fourth conductors 61, 62, 63, and 64 be copper from the viewpoint of cooling. However, other metals such as aluminum and the like or a metallic composite material such as Al—SiC, and the like may be used.

As shown in FIGS. 2 to 6, the radiator plate 67 is joined to the second joint surfaces 61b, 62b, 63b, and 64b of the first conductor 61, second conductor 62, third conductor 63, and fourth conductor 64 through the sheet-like insulator 66, and supports these conductors. The radiator plate 67 functioning as a heat radiation member is formed of a metal with a high degree of heat transfer property such as copper, aluminum, and the like, and radiates heat of the IGBTs, diodes, and first to fourth conductors to the outside. The sheet-like insulator 66 is formed of a material with sufficiently lower rigidity with respect to the first to fourth conductors, for example, an epoxy resin with an adhesive property filled with ceramic filler such as boron nitride.

The radiator plate 67 is joined to the first, second, third, and fourth conductors at a joint surface extending in a direction intersecting the first joint surface 61a of the first conductor 61, first joint surface 62a of the second conductor 62, first joint surface 63a of the third conductor, and first joint surface 64a of the fourth conductor 64, for example, in a direction perpendicular to the first joint surfaces 61a, 62a, 63a, and 64a. That is, the respective semiconductor elements including the IGBTs and diodes are arranged in such a manner that the surfaces of the semiconductor elements on the positive electrode side and negative electrode side are not parallel with the surface of the radiator plate 67.

Thermally-conductive grease (not shown) is applied to the back surface of the radiator plate 67, and the radiator plate 67 is fixed to a cooler (not shown) of the inverter device by means of screws or the like through the thermally-conductive grease.

As shown in FIGS. 3 to 5, a positive electrode output terminal 71 is connected to one end of the first conductor 61, and the terminal 71 is extended from the first conductor in one direction. A negative electrode output terminal 72 is connected to one end of the second conductor 62, and the terminal 72 is extended from the one end of the second conductor in the same direction as the positive electrode output terminal 71.

A first AC output terminal 73 is connected to the other end of the third conductor 63 opposed to the fourth conductor 64, and the terminal 73 is extended from the other end of the third conductor in the direction opposite to the positive electrode output terminal 71. The first AC output terminal 73 is extended beyond the other end of the fourth conductor through the notch 68 of the fourth conductor 64. The first AC output terminal 73 is arranged inside the notch 68 with a gap held around it, and is electrically insulated from the fourth conductor 64. It should be noted that the part around the first AC output terminal 73 inside the notch 68 may be filled with an insulating material.

A second AC output terminal 74 is connected to the other end of the fourth conductor 64, and the terminal 74 is extended from the other end of the fourth conductor in the direction opposite to the positive electrode output terminal 71.

A plurality of input/output terminals 76a, 76b, 76c, and 76d such as gate terminals and the like are connected to the IGBTs 41a, 41b, 41c, and 41d. Further, among the input/output terminals configured to drive the respective IGBTs, the emitter sense terminal is provided at a position other than the position of the IGBT element, i.e., at a position separate from the emitter electrode surface of the IGBT.

In this embodiment, an emitter sense terminal 78b corresponding to the IGBTs 41b and 41d is formed integral with the negative electrode output terminal 72, and upwardly protrudes from the proximal end part of the negative electrode output terminal. An emitter sense terminal 78c corresponding to the IGBT 41a is formed integral with the first AC output terminal 73, and upwardly protrudes from the proximal end part of the first AC output terminal. An emitter sense terminal 78d corresponding to the IGBT 41c is formed integral with the second AC output terminal 74, and upwardly protrudes from the proximal end part of the second AC output terminal.

Figure 7:
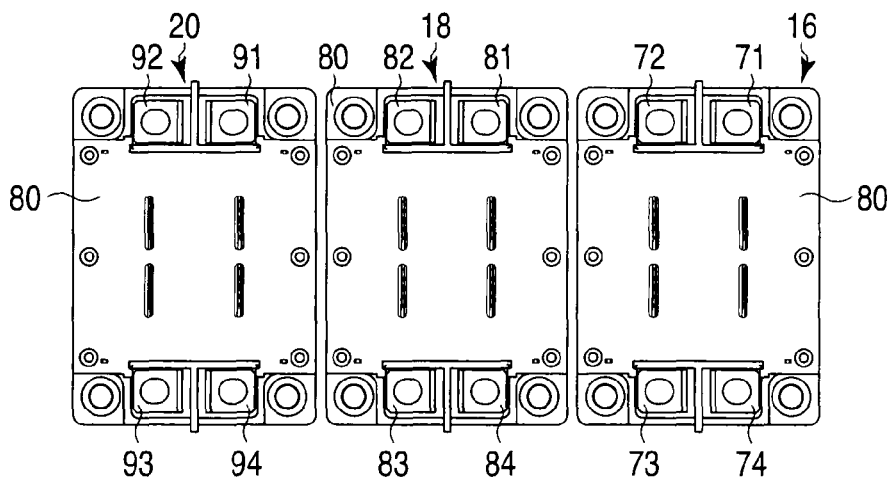
FIG. 7 is a plan view showing the power semiconductor nodule including the cover.

As shown in FIG. 7, the first to fourth conductors 61, 62, 63, and 64, and first to fourth semiconductor elements are covered with a cover 80 formed of a synthetic resin or the like. The cover 80 is fixed to, for example, the radiator plate 67. End parts of the positive electrode output terminal 71, negative electrode output terminal 72, first AC output terminal 73, and second AC output terminal 74 are provided to be exposed to the outside of the cover 80.

By the configuration described above, the power semiconductor module 16 for the U-phase is obtained. The power semiconductor module 18 for the V-phase, and power semiconductor module 20 for the W-phase are configured in the same manner as the power semiconductor module 16 for the U-phase described above. That is, as shown in FIG. 2, the power semiconductor module 18 for the V-phase is provided with an IGBT 42a and diode 52a each constituting the upper arm of the V-phase in the inverter circuit of the first system, IGBT 42b and diode 52b each constituting the lower arm of the V-phase in the inverter circuit of the first system, IGBT 42c and diode 52c each constituting the upper arm of the V-phase in the inverter circuit of the second system, IGBT 42d and diode 52d each constituting the lower arm of the V-phase in the inverter circuit of the second system, first conductor functioning as a common DC positive electrode conductor, second conductor functioning as a common DC negative electrode conductor, third conductor and fourth conductor arranged between the first and second conductors, positive electrode output terminal 81, negative electrode output terminal 82, first AC output terminal 83, second AC output terminal 84, sheet-like insulator, and radiator plate.

The power semiconductor module 20 for the W-phase is provided with an IGBT 43a and diode 53a each constituting the upper arm of the W-phase in the inverter circuit of the first system, IGBT 43b and diode 53b each constituting the lower arm of the W-phase in the inverter circuit of the first system, IGBT 43c and diode 53c each constituting the upper arm of the W-phase in the inverter circuit of the second system, IGBT 43d and diode 53d each constituting the lower arm of the W-phase in the inverter circuit of the second system, first conductor functioning as a common DC positive electrode conductor, second conductor functioning as a common DC negative electrode conductor, third conductor and fourth conductor arranged between the first and second conductors, positive electrode output terminal 91, negative electrode output terminal 92, first AC output terminal 93, second AC output terminal 94, sheet-like insulator, and radiator plate.

As shown in FIGS. 1 and 7, the three power semiconductor modules 16, 18, and 20 are arranged side by side on the same plane in a state where the directions of the positive electrode output terminals, negative electrode output terminals, first AC output terminals, and second AC output terminals of the respective power semiconductor modules 16, 18, and 20 coincide with each other. A DC electrode connection conductor 84a of the positive electrode side is connected to each of the positive electrode output terminals 71, 81, and 91 of the power semiconductor modules 16, 18, and 20. A DC electrode connection conductor 84b of the negative electrode side is connected to the negative electrode output terminals 72, 82, and 92. Further, the capacitor 24 is connected to the positive electrode output terminals and negative electrode output terminals. The power semiconductor modules 16, 18, and 20 are connected to a DC power supply device or battery through the DC electrode connection conductors 84a and 84b.

A three-phase output connection conductor 26 is connected to each of the first AC output terminals 73, 83, and 93 of the power semiconductor modules 16, 18, and 20, and a three-phase output connection conductor 27 is connected to each of the second AC output terminals 74, 84, and 94. The power semiconductor modules 16, 18, and 20 are connected to the first motor 12 through the three-phase output connection conductors 26, and are connected to the second motor 14 through the three-phase output connection conductors 27.

According to the inverter device configured in the manner described above, each of the power semiconductor modules is provided with the first and second semiconductor elements each constituting the inverter circuit of the first system, and third and fourth semiconductor elements each constituting the inverter circuit of the second system, the DC positive electrode conductor and DC negative electrode conductor which are shared by these semiconductor elements, and two AC electrode conductors separated into two uses for the semiconductor elements of the first system and semiconductor elements of the second system are provided, and the semiconductor elements are arranged to be interposed between these conductors. As a result of this, it becomes possible, as compared with the case where a plurality of power semiconductor modules each of which is configured to include the first system and second system set independently from each other are provided, to reduce the size of the power semiconductor module, and reduce the installation area of the power semiconductor module by about 23%. This makes it possible to downsize the overall semiconductor power converter provided with the power semiconductor modules.

Figure 8:
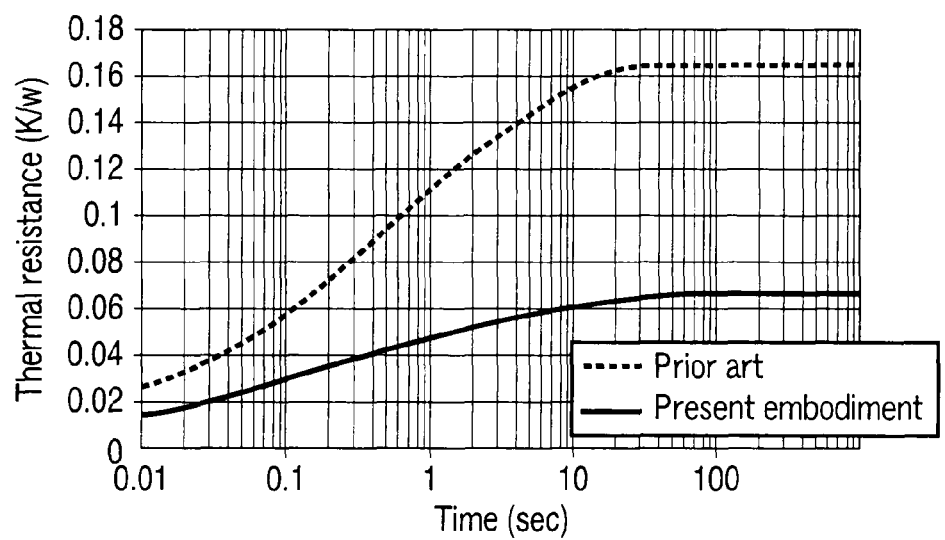
FIG. 8 is a graph showing a result of analysis of the thermal resistance of a semiconductor element.

Further, by causing the DC electrode conductor to be shared by the semiconductor elements of the first system and second system, it is possible to use a conductor with large thermal capacity and large heat discharge, and it is further possible to reduce the thermal resistance of the semiconductor element by about 60% as compared with the conventional case as shown in FIG. 8. Particularly in the case where the semiconductor elements of only one of the first system and second system are driven, it is possible to use a DC conductor shared by these semiconductor elements for heat radiation, and hence it becomes possible to improve the cooling efficiency.

In the power semiconductor module, the IGBTs in each of which the heat release value is greater than the diode are provided at positions shifted from each other in the longitudinal direction of the conductor without being opposed to each other. For example, in the above-mentioned embodiment, the plurality of IGBTs are disposed in a staggered arrangement. As a result of this, it is possible, in the third and fourth conductors arranged between the IGBTs, to reduce the interference of heat components from the IGBTs, and prevent the heat from being easily accumulated. This makes it possible to reduce the thermal resistance of the semiconductor element by about 13%.

When the first AC output terminal 73 is led from the third conductor 63 to the outside, the first AC output terminal is arranged inside the notch 68 formed in the fourth conductor 64. As a result of this, it is possible, as compared with the case where the first AC output terminal 73 is extended through the part above the fourth conductor 64, to reduce the height of the power semiconductor module by about 25%, and hence it becomes possible to downsize the power semiconductor module. Further, even when the conductor is provided with the notch, it is possible to prevent the thermal resistance from being increased by employing the above-mentioned configuration.

According to the power semiconductor module, the positive electrode output terminal, and negative electrode output terminal are arranged on one side of the module, and first and second AC output terminals are arranged on the opposite side of the DC output terminals with respect to the module. As a result of this, it is possible to simplify the connection conductors used to connect the power semiconductor module and other configuration members to each other. At the same time, it becomes possible to shorten the connection distance of the connection conductors, and reduce the inductance of the semiconductor power converter.

Furthermore, according to the power semiconductor module described above, among the input/output terminals of the IGBT which is the switching element, the emitter sense terminal is provided at a position other than the position of the IGBT element, e.g., at the proximal end part of the output terminal. As a result of this, a structure is obtained in which a conductor intervenes between the emitter of the switching element and emitter sense terminal, and the switching element includes inductance on the emitter side. Thus, even when both the surfaces of the switching element are joined to the conductors, it is possible to prevent a vibration phenomenon of the switching element from occurring.

From the above description, it is possible to obtain a power semiconductor module, and semiconductor power converter which can be further reduced in size, and in which the cooling efficiency can be further improved.

Next, a power semiconductor module according to a second embodiment of the present invention will be described.

Figure 9:
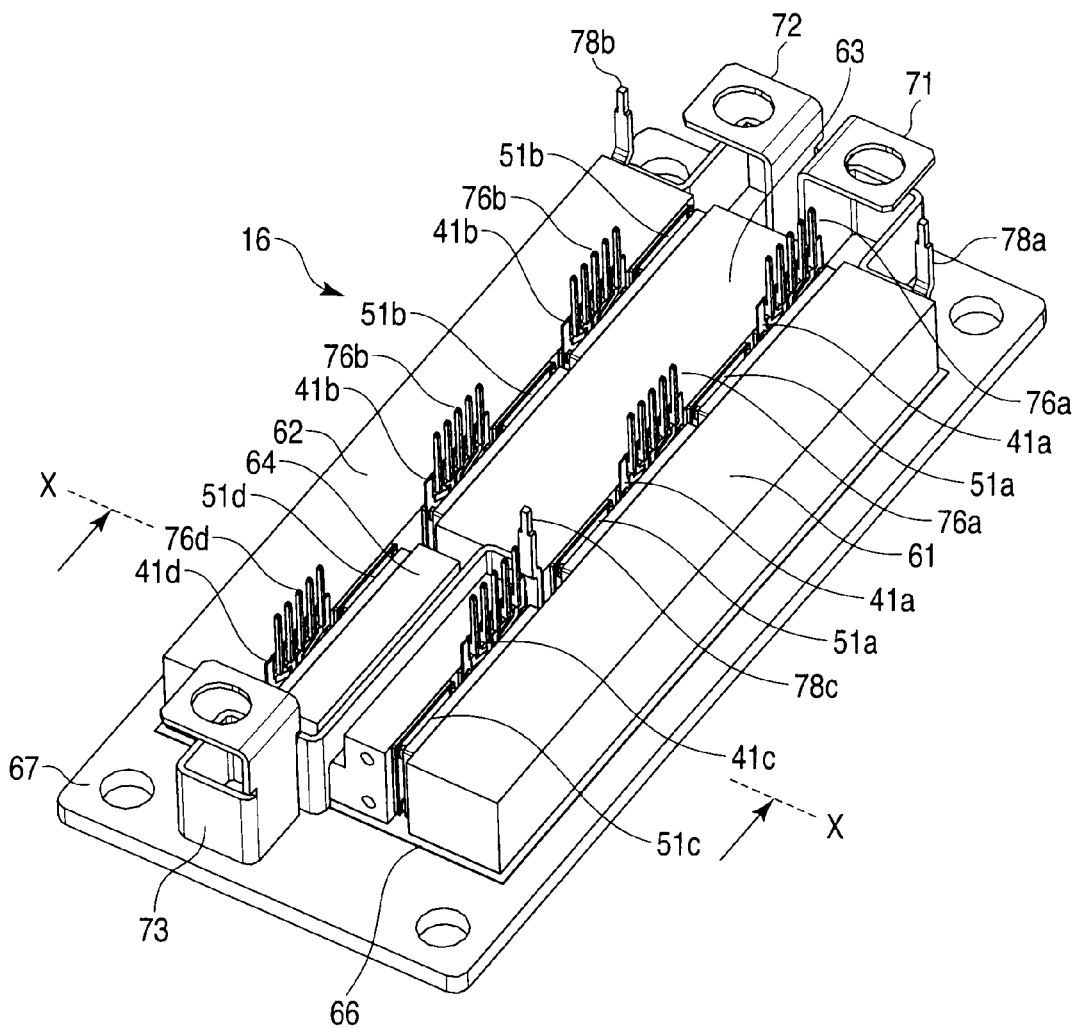
FIG. 9 is a perspective view showing a power semiconductor module according to a second embodiment.
Figure 10:
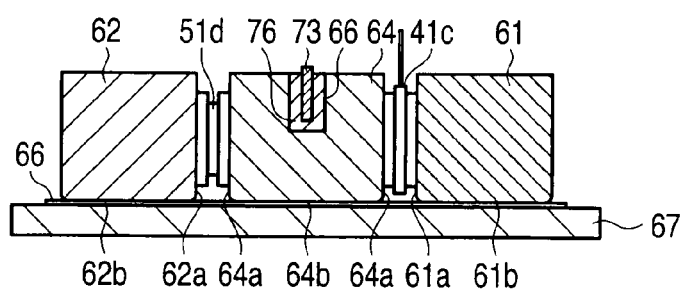
FIG. 10 is a cross-sectional view of the power semiconductor module taken along line X-X in FIG. 9.

FIG. 9 shows the power semiconductor module according to the second embodiment with a cover thereof removed, and FIG. 10 shows the cross section of part of the power semiconductor module.

As shown in FIGS. 9 and 10, a first AC output terminal 73 extended from a third conductor 63 is further extended through the inside of a notch 68 formed in a fourth conductor 64. The inside of the notch 68 is filled with a conductive bonding agent 76. The first AC output terminal 73 is connected to the fourth conductor 64 through the conductive bonding agent 76, whereby the third conductor 63 and the fourth conductor 64 are electrically connected to each other. An AC output terminal to be connected to the fourth conductor 64 is omitted.

Further, an IGBT 41c and diode 51c interposed between the fourth conductor 64 and first conductor 61 constitute, together with IGBTs 41a and diodes 51a, an upper arm in an inverter circuit of the first system. An IGBT 41d and diode 51d interposed between the fourth conductor 64 and a second conductor 62 constitute, together with IGBTs 41b and diodes 51b, a lower arm in the inverter circuit of the first system.

In the second embodiment, the other configuration of the power semiconductor module is identical with the first embodiment described previously, the same parts as the first embodiment are denoted by the same reference symbols as the first embodiment, and detailed description of them are omitted.

According to the power semiconductor module configured as described above, a large-capacity power semiconductor module with two-arm structure can be configured by using the members constituting the power semiconductor module with the multi-arm structure according to the first embodiment described, and by using the simple configuration in which the first AC output terminal 73 is only made to secure continuity between itself and the fourth conductor 64. Accordingly, standardization of components is enabled between the power semiconductor module with the multi-arm structure, and large-capacity power semiconductor module with the two-arm structure, and hence cost reduction of the components and power semiconductor module can be realized.

Figure 11:
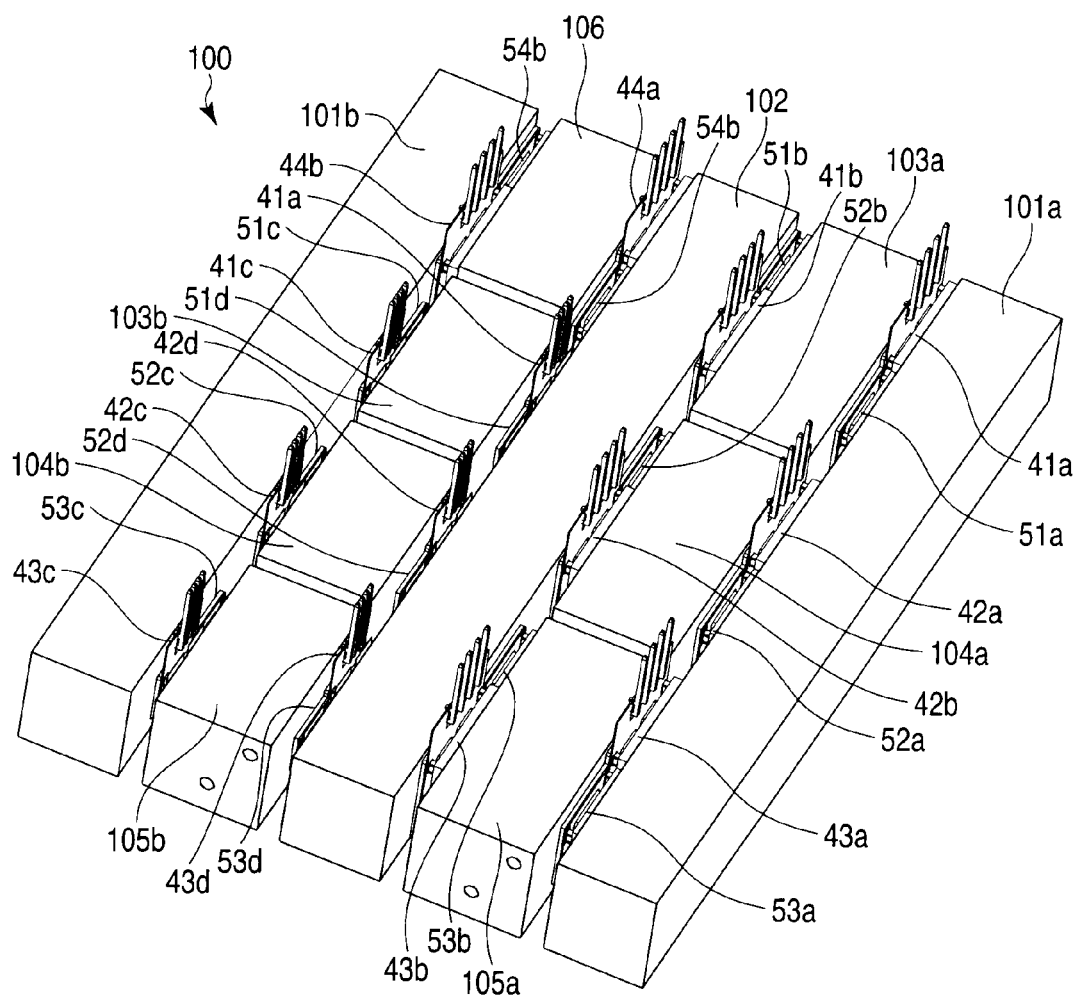
FIG. 11 is a perspective view showing a power semiconductor module according to a third embodiment.

Next, a power semiconductor module according to a third embodiment of the present invention will be described. FIG. 11 shows a main part of the power semiconductor module according to the third embodiment. According to the third embodiment, the power semiconductor module is provided with three sets of semiconductor elements constituting three-phase arms in a circuit of a first system, three sets of semiconductor elements constituting three-phase arms in a circuit of a second system, and a plurality of conductors, all of which are configured as one body, and are formed as one power semiconductor module.

As shown in FIG. 11, the power semiconductor module 100 is provided with an IGBT 41a and diode 51a each constituting an upper arm of the U-phase in an inverter circuit of a first system, IGBT 41b and diode 51b each constituting a lower arm of the U-phase, IGBT 42a and diode 52a each constituting an upper arm of the V-phase in the inverter circuit of the first system, IGBT 42b and diode 52b each constituting a lower arm of the V-phase, IGBT 43a and diode 53a each constituting an upper arm of the W-phase in the inverter circuit of the first system, IGBT 43b and diode 53b each constituting a lower arm of the W-phase, IGBT 41c and diode 51c each constituting an upper arm of the U-phase in an inverter circuit of a second system, IGBT 41d and diode 51d each constituting a lower arm of the U-phase, IGBT 42c and diode 52c each constituting an upper arm of the V-phase in the inverter circuit of the second system, IGBT 42d and diode 52d each constituting a lower arm of the V-phase, IGBT 43c and diode 53c each constituting an upper arm of the W-phase in the inverter circuit of the second system, IGBT 43d and diode 53d each constituting a lower arm of the W-phase, and further two sets of IGBTs 44a and 44b, and diodes 54a and 54b each of which is used for voltage step-up.

The plurality of IGBTs and diodes are semiconductor chips with a size of, for example, about 10 mm square. Each of the diodes is connected in inversely parallel to each of the IGBTs.

The power semiconductor module 100 is provided with a pair of first conductors 101a and 101b each functioning as a DC positive electrode conductor to be shared by and used for a plurality of semiconductor elements, second conductor 102 functioning as a DC negative electrode conductor to be shared by and used for a plurality of semiconductor elements, two third conductors 103a and 103b each functioning as an AC electrode conductor separated into a plurality of parts for each semiconductor element, two fourth conductors 104a and 104b, two fifth conductors 105a and 105b, and sixth conductor 106.

The power semiconductor module 100 includes a radiator plate joined to the first to sixth conductors through an insulating sheet (not shown).

Each of the first, second, third, fourth, fifth, and sixth conductors 101a to 106 is formed of a conductive metal into, for example, a thin and long column-like shape with both end parts in the axial direction. The first conductors 101a and 101b, and second conductor 102 are formed into the same length, third, fourth, fifth, and sixth conductors 103a, 103b, 104a, 104b, 105a, 105b, and 106 are formed in such a manner that each of the third to sixth conductors is shorter than the length of the first or second conductor, and the sum total of the lengths of the third, fourth, and fifth conductors is slightly shorter than the length of the first or second conductor. The first and second conductors are formed into substantially the same diameter. The third to sixth conductors are each formed into the same diameter, and are formed into a width slightly larger than the width of the first or second conductor.

One side surface of the first conductor 101a constituting the common DC positive electrode conductor forms a first joint surface, and the other side surface thereof perpendicular to this side surface forms a second joint surface. The first joint surface of the first conductor 101a is electrically and mechanically joined to the positive electrode side of the IGBT 41a and diode 51a each constituting the upper arm of the U-phase in the circuit of the first system, the positive electrode side of the IGBT 42a and diode 52a each constituting the upper arm of the V-phase, and the positive electrode side of the IGBT 43a and diode 53a each constituting the upper arm of the W-phase.

On the first joint surface of the first conductor 101a, the IGBT 41a, diode 51a, IGBT 42a, diode 52a, IGBT 43a, and diode 53a are arranged in a line along substantially the entire length of the first conductor 101a in the longitudinal direction and, further the IGBTs and diodes are alternately arranged.

Each of two side surfaces of the second conductor 102 constituting the common DC negative electrode conductor opposed to each other constitutes a first joint surface, and the other side surface perpendicular to the above two side surfaces forms a second joint surface. The second conductor 102 is arranged side by side in parallel with the first conductor 101a with a gap held between them. Further, the one joint surface of the second conductor 102, and the first joint surface of the first conductor 101a are opposed to each other in parallel with each other with a gap held between them. The second joint surface of the first conductor 101a, and second joint surface of the second conductor 102 are positioned flush with each other on the same plane.

The one first joint surface of the second conductor 102 is electrically and mechanically joined to the negative electrode side of the IGBT 41b and diode 51b each constituting the lower arm of the U-phase in the circuit of the first system, the negative electrode side of the IGBT 42b and diode 52b each constituting the lower arm of the V-phase, and the negative electrode side of the IGBT 43b and diode 53b each constituting the lower arm of the W-phase.

On the first joint surface of the second conductor 102, the IGBT 41b, diode 51b, IGBT 42b, diode 52b, IGBT 43b, and diode 53b are arranged in a line along substantially the entire length of the second conductor 102 in the longitudinal direction and, further the IGBTs and diodes are alternately arranged.

The IGBTs 41b, 42b, and 43b respectively joined to the second conductor 102 are arranged at positions shifted from the IGBTs 41a, 42a, and 43a respectively joined to the first conductor 101a in the longitudinal direction of the first conductor, and are arranged to be opposed to the diodes 51a, 52a, and 53a respectively joined to the first conductor 101a without being opposed to the IGBTs 41a, 42a, and 43a. Likewise, the IGBTs 41a, 42a, and 43a joined to the first conductor 101a are respectively arranged to be opposed to the diodes 51b, 52b, and 53b respectively joined to the second conductor 102. In other words, the IGBTs 41a, 42a, and 43a respectively joined to the first conductor 101a, and the IGBTs 41b, 42b, and 43b respectively joined to the second conductor 102 are arranged in a staggering manner with respect to the first and second conductors.

The other first joint surface of the second conductor 102 is electrically and mechanically joined to the negative electrode side of the IGBT 44a and diode 54a each of which is used for voltage step-up, the negative electrode side of the IGBT 41d and diode 51d each constituting the lower arm of the U-phase in the circuit of the second system, the negative electrode side of the IGBT 42d and diode 52d each constituting the lower arm of the V-phase, and the negative electrode side of the IGBT 43d and diode 53d each constituting the lower arm of the W-phase. As a result of this, the second conductor 102 constitutes a DC negative electrode conductor to be shared by the semiconductor elements of the first system and semiconductor elements of the second system.

On the first joint surface of the second conductor, the IGBT 44a, diode 54a, IGBT 41d, diode 51d, IGBT 42d, diode 52d, IGBT 43d, and diode 53d are arranged in a line along substantially the entire length of the second conductor 102 in the longitudinal direction thereof, and further the IGBTs and diodes are alternately arranged.

The IGBT 44a, and IGBTs 41d, 42d, and 43d which are joined to the other first joint surface of the second conductor 102 are arranged at positions on the second conductor shifted in the longitudinal direction thereof with respect to the IGBTs 41b, 42b, and 43b which are joined to the one joint surface of the second conductor 102, and are arranged to face the diodes 51b, 52b, and 53b which are joined to the second conductor 102 without facing the IGBTs 41b, 42b, and 43b.

One side surface of the first conductor 101b constituting a common DC positive electrode conductor forms a first joint surface, and the other side surface perpendicular to this side surface forms a second joint surface. The first conductor 101b is arranged side by side with the second conductor 102 in parallel with each other with a gap held between them. Further, the first joint surface of the first conductor 101b, and the other first joint surface of the second conductor 102 are arranged to face each other in parallel with each other with a gap held between them. The second joint surface of the first conductor 101b, and second joint surface of the second conductor 102 are positioned flush with each other on the same plane.

The first joint surface of the first conductor 101b is electrically and mechanically joined to the positive electrode side of the IGBT 44b and diode 54b each of which is used for voltage step-up, the positive electrode side of the IGBT 41c and diode 51c each constituting the upper arm of the U-phase in the circuit of the second system, the positive electrode side of the IGBT 42c and diode 52c each constituting the lower arm of the V-phase, and the positive electrode side of the IGBT 43c and diode 53c each constituting the upper arm of the W-phase.

On the first joint surface of the first conductor 101b, the IGBT 44b, diode 54b, IGBT 41c, diode 51c, IGBT 42c, diode 52c, IGBT 43c, and diode 53c are arranged in a line along substantially the entire length of the first conductor 101b in the longitudinal direction thereof, and further the IGBTs and diodes are alternately arranged.

The IGBT 44b, and IGBTs 41c, 42c, and 43c respectively joined to the first joint surface of the first conductor 101b are arranged at positions shifted from the IGBT 44a, and IGBTs 41d, 42d, and 43d respectively joined to the other first joint surface of the second conductor 102 in the longitudinal direction of second conductor, and are arranged to be opposed to the diodes 54a, 51d, 52d, and 53d respectively joined to the second conductor 102 without being opposed to the IGBT 44a, and IGBTs 41d, 42d, and 43d.

The third conductor 103a is arranged between the first conductor 101a and second conductor 102 with gaps held between them. The third conductor 103a is arranged in such a manner that one end part thereof in the axial direction is aligned with one end part of each of the first and second conductors 101a and 102 in the axial direction. Two side surfaces of the third conductor 103a opposed to each other form two first joint surfaces respectively opposed in parallel to the first joint surface of the first conductor 101a, and first joint surface of the second conductor 102. Further, the other side surface perpendicular to the above two side surfaces of the third conductor 103a forms a second joint surface. The second joint surface is positioned flush with the second joint surfaces of the first and second conductors 101a and 102 on the same plane.

The one first joint surface of the third conductor is electrically and mechanically joined to the negative electrode side of the IGBT 41a and diode 51a each constituting the upper arm of the U-phase of the first system. The other first joint surface of the third conductor 103a is electrically and mechanically joined to the positive electrode side of the IGBT 41b and diode 51b each constituting the lower arm of the first system. As a result of this, the third conductor 103a constitutes an AC electrode (output electrode) conductor of the first system.

The fourth conductor 104a is arranged between the first conductor 101a and second conductor 102 with gaps held between them, and is further arranged in line with the third conductor 103a with a gap held between them. One end part of the fourth conductor 104a in the axial direction is opposed to one end part of the third conductor 103a with the gap held between them.

Two side surfaces of the fourth conductor 104a opposed to each other form two first joint surfaces respectively opposed in parallel to the first joint surface of the first conductor 101a, and first joint surface of the second conductor 102. Further, the other side surface of the fourth conductor 104a perpendicular to the above two side surfaces forms a second joint surface. The second joint surface is positioned flush with the second surfaces of the first and second conductors 101*a* and 102 on the same plane.

The one first joint surface of the fourth conductor 104*a* is electrically and mechanically joined to the negative electrode side of the IGBT 42*a* and diode 52*a* each constituting the upper arm of the V-phase of the first system. The other first joint surface of the fourth conductor 104*a* is electrically and mechanically joined to the positive electrode side of the IGBT 42*b* and diode 52*b* each constituting the lower arm of the V-phase of the first system. As a result of this, the fourth conductor 104*a* constitutes an AC electrode conductor of the first system.

The fifth conductor 105*a* is arranged between the first conductor 101*a* and second conductor 102 with gaps held between them, and is further arranged in line with the fourth conductor 104*a* with a gap held between them. One end part of the fifth conductor 105*a* in the axial direction is opposed to one end part of the fourth conductor 104*a* with the gap held between them, and the other end part thereof in the axial direction is arranged in alignment with the other end parts of the first and second conductors 101*a* and 102.

Two side surfaces of the fifth conductor 105*a* opposed to each other form two first joint surfaces respectively opposed in parallel to the first joint surface of the first conductor 101*a*, and first joint surface of the second conductor 102. Further, the other side surface of the fifth conductor 105*a* perpendicular to the above two side surfaces forms a second joint surface. The second joint surface is positioned flush with the second joint surfaces of the first and second conductors 101*a* and 102 on the same plane.

The one first joint surface of the fifth conductor 105*a* is electrically and mechanically joined to the negative electrode side of the IGBT 43*a* and diode 53*a* each constituting the upper arm of the W-phase of the first system. The other first joint surface of the fifth conductor 105*a* is electrically and mechanically joined to the positive electrode side of the IGBT 43*b* and diode 53*b* each constituting the lower arm of the W-phase of the first system. As a result of this, the fifth conductor 105*a* constitutes an AC electrode conductor of the first system.

The sixth conductor 106 is arranged between the first conductor 101*b* and second conductor 102 with gaps held between them. The sixth conductor 106 is arranged in such a manner that an end part thereof in the axial direction is aligned with one end part of each of the first and second conductors 101*b* and 102 in the axial direction. Two side surfaces of the sixth conductor 106 opposed to each other form two first joint surfaces respectively opposed in parallel to the first joint surface of the first conductor 101*b*, and first joint surface of the second conductor 102. Further, the other side surface of the sixth conductor 106 perpendicular to the above two side surfaces forms a second joint surface. The second joint surface is positioned flush with the second joint surfaces of the first and second conductors 101*b* and 102 on the same plane.

The one joint surface of the sixth conductor 106 is electrically and mechanically joined to the negative electrode side of the IGBT 44*b* and diode 54*b*. The other first joint surface of the sixth conductor 106 is electrically and mechanically joined to the positive electrode side of the IGBT 44*a* and diode 54*a*.

The third conductor 103*b* is arranged between the first conductor 101*b* and second conductor 102 with gaps held between them, and is further arranged in line with the sixth conductor 106 with a gap held between them. One end part of the third conductor 103*b* in the axial direction is opposed to one end part of the sixth conductor 106 with the gap held between them. Two side surfaces of the third conductor 103*b* opposed to each other form two first joint surfaces respectively opposed in parallel to the first joint surface of the first conductor 101*b*, and first joint surface of the second conductor 102. Further, the other side surface of the third conductor 103*b* perpendicular to the above two side surfaces forms a second joint surface. The second joint surface is positioned flush with the second joint surfaces of the first and second conductors 101*b* and 102 on the same plane.

The one joint surface of the third conductor 103*b* is electrically and mechanically joined to the negative electrode side of the IGBT 41*c* and diode 51*c* each constituting the upper arm of the U-phase of the second system. The other joint surface of the third conductor 103*b* is electrically and mechanically joined to the positive electrode side of the IGBT 41*d* and diode 51*d* each constituting the lower arm of the U-phase of the second system. As a result of this, the third conductor 103*b* constitutes an AC electrode conductor of the second system.

The fourth conductor 104*b* is arranged between the first conductor 101*b* and second conductor 102 with gaps held between them, and is further arranged in line with the third conductor 103*b* with a gap held between them. One end part of the fourth conductor 104*b* in the axial direction is opposed to one end part of the third conductor 103*b* with the gap held between them.

Two side surfaces of the fourth conductor 104*b* opposed to each other form two first joint surfaces respectively opposed in parallel to the first joint surface of the first conductor 101*b*, and first joint surface of the second conductor 102. Further, the other side surface of the fourth conductor 104*b* perpendicular to the above two side surfaces forms a second joint surface. The second joint surface is positioned flush with the second joint surfaces of the first and second conductors 101*b* and 102 on the same plane.

The one first joint surface of the fourth conductor 104*b* is electrically and mechanically joined to the negative electrode side of the IGBT 42*c* and diode 52*c* each constituting the upper arm of the V-phase of the second system. The other first joint surface of the fourth conductor 104*b* is electrically and mechanically joined to the positive electrode side of the IGBT 42*d* and diode 52*d* each constituting the lower arm of the V-phase of the second system. As a result of this, the fourth conductor 104*b* constitutes an AC electrode conductor of the second system.

The fifth conductor 105*b* is arranged between the first conductor 101*b* and second conductor 102 with gaps held between them, and is further arranged in line with the fourth conductor 104*b* with a gap held between them. One end part of the fifth conductor 105*b* in the axial direction is opposed to one end part of the fourth conductor 104*b* with the gap held between them, and the other end part thereof in the axial direction is arranged in alignment with the other end parts of the first and second conductors 101*b* and 102 in the axial direction. Two side surfaces of the fifth conductor 105*b* opposed to each other form two first joint surfaces respectively opposed in parallel to the first joint surface of the first conductor 101*b*, and first joint surface of the second conductor 102. Further, the other side surface of the fifth conductor 105*b* perpendicular to the above two side surfaces forms a second joint surface. The second joint surface is positioned flush with the second joint surfaces of the first and second conductors 101*b* and 102 on the same plane.

The one first joint surface of the fifth conductor 105*b* is electrically and mechanically joined to the negative electrode side of the IGBT 43*c* and diode 53*c* each constituting the upper arm of the W-phase of the first system. The other first joint surface of the fifth conductor 105b is electrically and mechanically joined to the positive electrode side of the IGBT 43d and diode 53d each constituting the lower arm of the W-phase of the first system. As a result of this, the fifth conductor 105b constitutes an AC electrode conductor of the first system.

It should be noted that joining of the joint surfaces of the respective conductors and IGBTs or diodes to each other can be carried out by using solder or a conductive adhesive, and may be carried out through a thermal shock plate. As for the material for the first to sixth conductors, although copper is desirable from the viewpoint of cooling, other metals such as aluminum, and the like, and a metallic composite material such as Al—SiC, and the like may also be used. Further, output terminals (not shown) are connected to the respective conductors.

According to the power semiconductor module associated with the third embodiment configured as described above, the plurality of semiconductor elements constituting the circuit of the first system, and plurality of semiconductor elements constituting the circuit of the second system are interposed and arranged between the plurality of conductors, and a DC electrode conductor to be shared by the semiconductor elements of the first system, and semiconductor elements of the second system is constituted by at least one conductor of the plurality conductors. As a result of this, the size of the power semiconductor module can be further reduced as compared with the case where a power semiconductor module is constituted for each circuit of the systems. Further, the DC electrode is constituted by a common conductor, whereby the thermal resistance can be reduced. Furthermore, a plurality of IGBTs are arranged at positions shifted from the relevant IGBTs without being opposed to each other, and hence it is possible to prevent heat from being accumulated, and reduce the thermal resistance. As a result of this, it is possible to improve the coolability of the power semiconductor module.

Next, an inverter device provided with a power semiconductor module according to a fourth embodiment of the present invention will be described below. It should be noted that the other configuration of the inverter device provided with the power semiconductor module is identical with the first embodiment described previously, and the same parts as the first embodiment are denoted by the same reference symbols as the first embodiment, and detailed description of them are omitted.

Figure 12:
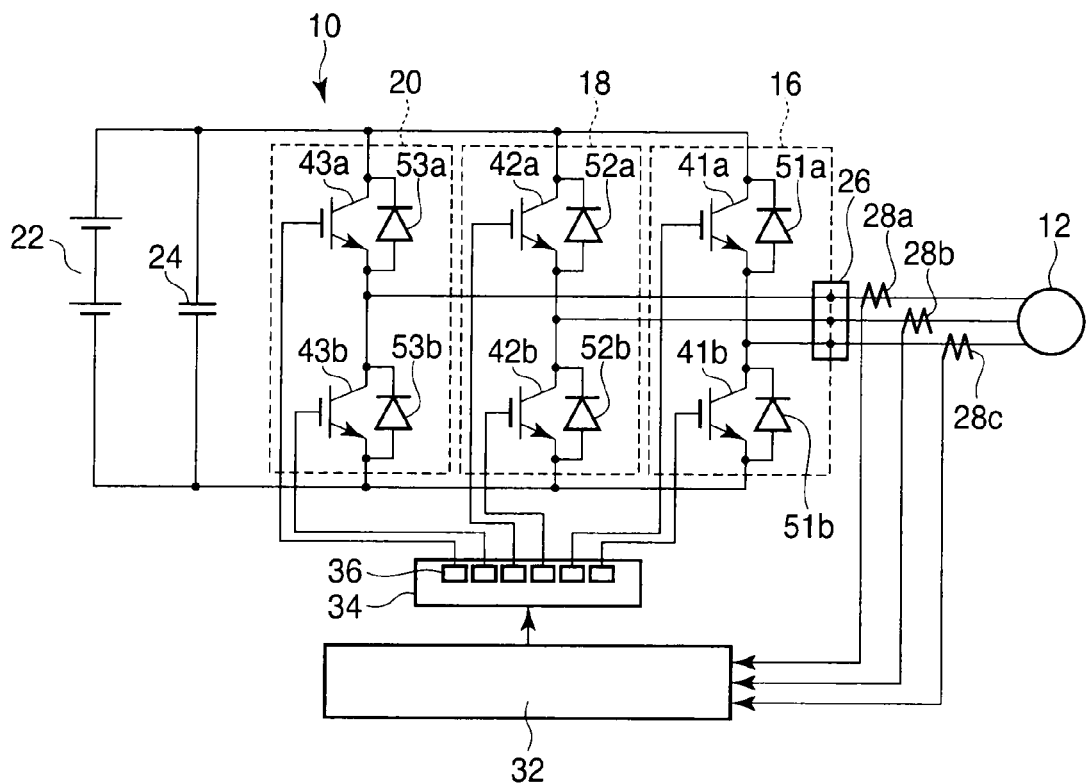
FIG. 12 is an equivalent circuit diagram of an inverter device according to a fourth embodiment of the present invention.

FIG. 12 shows an equivalent circuit diagram of the inverter device. As shown in FIG. 12, the inverter device 10 is configured as, for example, a three-phase inverter of the U-phase, V-phase, and W-phase, and is configured to supply power to a motor 12 as an objective load. The inverter device 10 is provided with an inverter circuit used to supply power to the motor 12 as an integral part.

The inverter device 10 is provided with three power semiconductor modules 16, 18, and 20 corresponding to the U-phase, V-phase, and W-phase, a smoothing capacitor 24 configured to smooth a DC voltage to be supplied from a DC power source, for example, a battery 22 to the power semiconductor modules, current detectors 28a, 28b, and 28c configured to detect currents flowing to the motor 12 through a three-phase output connection conductor 26, a control unit 32 configured to control the power semiconductor modules 16, 18, and 20 on the basis of information on the currents detected by the current detectors, a voltage applied to the smoothing capacitor 24, and the like, and a drive circuit board 34 including a drive circuit configured to drive a gate of a semiconductor element of a power semiconductor module to be described later. The drive circuit board 34 is provided with drive ICs 36 configured to drive semiconductor elements in a one-to-one correspondence with the semiconductor elements. That is, in this circuit, six drive ICs 36 are provided. Further, beneath the power semiconductor modules 16, 18, and 20, and smoothing capacitor 24, a radiator (not shown) such as a heat sink or the like configured to cool these members is provided.

The power semiconductor modules 16, 18, and 20 will be described below in detail. Each of the power semiconductor modules 16, 18, and 20 is configured in the same manner, and hence the power semiconductor module 16 will be described below as a representative.

Figure 13:
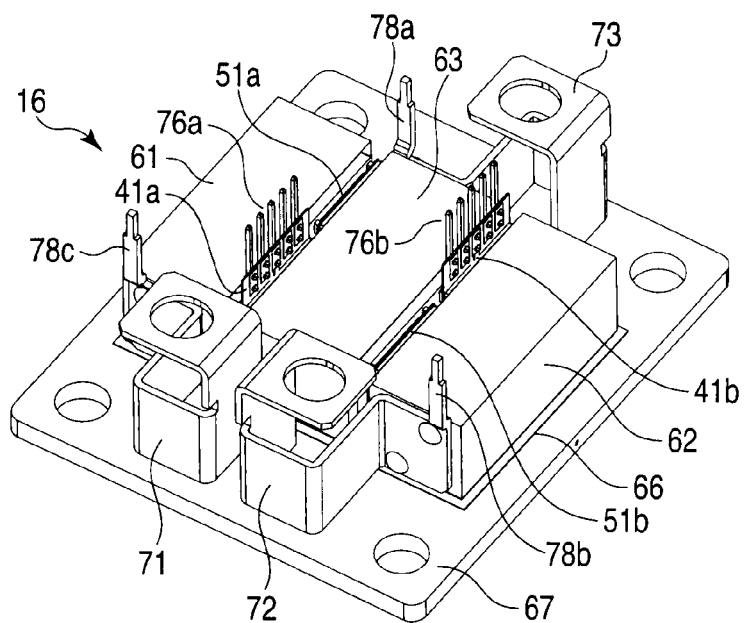
FIG. 13 is a perspective view showing a power semiconductor module of the inverter device according to the fourth embodiment with the cover thereof removed.

FIG. 13 is a perspective view showing the power semiconductor module 16 in a state where the cover thereof is removed, and FIG. 14 is a plan view of the power semiconductor module.

As shown in FIGS. 12, 13, and 14, the power semiconductor module 16 is provided with first semiconductor elements constituting an upper arm of the U-phase in the inverter circuit, i.e., an IGBT 41a serving as a first switching element, and diode 51a in this case, second semiconductor elements constituting a lower arm of the U-phase in the inverter circuit, i.e., an IGBT 41b functioning as a second switching element, and diode 51b in this case, first conductor 61, second conductor 62, third conductor 63, sheet-like insulator 66, and radiator plate 67 functioning as a base.

The IGBTs 41a and 41b, and diodes 51a and 51b are semiconductor chips with a size of, for example, about 10 mm square. The diodes 51a and 51b are connected in inversely parallel to the IGBTs 41a and 41b, respectively.

Each of the first, second, and third conductors 61, 62, and 63 is formed of a conductive metal into a long and thin rod-like shape with both end parts in the axial direction, for example, a rectangular column-like shape. The first conductor 61, second conductor 62, and third conductor 63 have the same length, and are formed into substantially the same diameter.

One side surface of the first conductor 61 forms a first joint surface 61a, and the other side surface perpendicular to this side surface forms a second joint surface. The first joint surface 61a of the first conductor 61 is electrically and mechanically joined to the positive electrode side (a collector, and cathode, respectively) of the IGBT 41a, and diode 51a each constituting the upper arm. The first conductor 61 constitutes a DC positive electrode conductor to be shared by the first semiconductor elements. On the first joint surface 61a, the IGBT 41a and diode 51a are arranged in a line in the longitudinal direction (central axis line direction) of the first conductor 61.

One side surface of the second conductor 62 forms a first joint surface 62a, and the other side surface perpendicular to this side surface forms a second joint surface. The first joint surface 62a of the second conductor is joined to the negative electrode side (an emitter, and anode, respectively) of the IGBT 41b and diode 51b each constituting the lower arm. As a result of this, the second conductor 62 is electrically and mechanically connected to the electrodes of the IGBT 41b and diode 51b of the negative electrode side. The second conductor 62 constitutes a DC negative electrode conductor to be shared by the second semiconductor elements. On the first joint surface 62a, the IGBT 41b and diode 51b are arranged in a line in the longitudinal direction (central axis line direction) of the second conductor 62.

The second conductor 62 is arranged in parallel with the first conductor with a gap held between them. Further, the first joint surface 61a of the first conductor 61, and first joint surface 62a of the second conductor 62 are opposed to each other in parallel with each other with the gap held between them. The second joint surface of the first conductor 61, and second joint surface of the second conductor 62 are positioned flush with each other on the same plane.

As shown in FIGS. 13 and 14, the third conductor 63 is arranged between the first conductor 61 and second conductor 62 in parallel with the first and second conductors with gaps held between them. The third conductor 63 is arranged in such a manner that one end part thereof in the axial direction is in alignment with one end part of each of the first and second conductors 61 and 62 in the axial direction. The third conductor 63 is arranged in such a manner that the other end part thereof in the axial direction is in alignment with the other end part of each of the first and second conductors 61 and 62 in the axial direction. The third conductor 63 has a central axis line C in the longitudinal direction thereof, and the first, second, and third conductors 61, 62, and 63 are arranged bilaterally symmetrical with respect to the central axis line C.

Two side surfaces of the third conductor opposed to each other form two first joint surfaces 63a, and these first joint surfaces 63a are opposed in parallel to the first joint surface 61a of the first conductor 61, and first joint surface 62a of the second conductor, respectively. Further, the other side surface of the third conductor 63 perpendicular to the above two side surfaces forms a second joint surface. The second joint surface is positioned flush with the second surfaces of the first and second conductors 61 and 62 on the same plane.

The one joint surface 63a of the third conductor 63 is joined to the negative electrode side (an emitter, and anode, respectively) of the IGBT 41a and diode 51a each constituting the upper arm, and the third conductor 63 is electrically and mechanically connected to the electrodes of the IGBT 41a and diode 51a of the negative electrode side. The other joint surface 63a of the third conductor 63 is joined to the positive electrode side (a collector, and cathode, respectively) of the IGBT 41b and diode 51b each constituting the lower arm, and the third conductor 63 is electrically and mechanically connected to the electrodes of the IGBT 41b and diode 51b of the positive electrode side. As a result of this, the third conductor 63 constitutes an AC electrode conductor (electrode conductor).

As shown in FIGS. 13 and 14, the IGBT 41a joined to the one first joint surface 63a of the third conductor 63 is arranged at a position shifted from the IGBT 41b joined to the other first joint surface 63a of the third conductor 63 in the direction along the central axis line C, and is arranged to be opposed to the diode 51b joined to the other first joint surface of the third conductor 63 without being opposed to the IGBT 41b. Likewise, the IGBT 41b joined to the other first joint surface 63a of the third conductor 63 is arranged to be opposed to the diode 51a joined to the third conductor 63. In other words, as can be seen well from FIG. 2, the IGBTs 41a and 41b joined to both the sides of the third conductor 63 are arranged at positions asymmetrical with respect to the central axis line C of the third conductor.

It should be noted that joining of the joint surfaces of the respective conductors and IGBTs or diodes to each other can be carried out by using solder or a conductive adhesive, and may be carried out through a thermal shock plate. As for the material for the first, second, and third conductors 61, 62, and 63, although copper is desirable from the viewpoint of cooling, other metals such as aluminum, and the like, and a metallic composite material such as Al—SiC, and the like may also be used.

As shown in FIGS. 13 and 14, the radiator plate 67 is bonded to the second joint surfaces of the first conductor 61, second conductor 62, and third conductor 63 through the sheet-like insulator 66, and supports these conductors. The radiator plate 67 functioning as a heat radiation member is formed of a metal with a high degree of heat transfer property such as copper, aluminum, and the like, and radiates heat of the IGBTs, diodes, and first to third conductors to the outside. The sheet-like insulator 66 is formed of a material with sufficiently lower rigidity with respect to the first to third conductors, for example, an epoxy resin with an adhesive property filled with ceramic filler such as boron nitride.

A top surface of the radiator plate 67 joined to the first, second, and third conductors 61, 62, and 63, i.e., the joint surface extends in a direction intersecting the first joint surface 61a of the first conductor 61, first joint surface 62a of the second conductor 62, and first joint surface 63a of the third conductor 63, e.g., a direction perpendicular to these first joint surfaces 61a, 62a, and 63a. That is, the respective semiconductor elements, i.e., the IGBTs and diodes are arranged in such a manner that their surfaces of the positive electrode side and negative electrode side are not parallel with the joint surface of the radiator plate 67.

Thermally-conductive grease (not shown) is applied to the back surface of the radiator plate 67, and the radiator plate is fixed to a cooler (not shown) of the inverter device by means of screws or the like through the thermally-conductive grease.

As shown in FIGS. 13 and 14, a positive electrode output terminal 71 is connected to one end of the first conductor 61 in the axial direction, and the terminal 71 is extended from the first conductor in one direction. A negative electrode output terminal 72 is connected to one end of the second conductor 62 in the axial direction, and the terminal 72 is extended from the one end of the second conductor in the same direction as the positive electrode output terminal 71. An AC output terminal 73 is connected to the other end of the third conductor 63 in the axial direction, i.e., the other end thereof positioned on the opposite side of the positive electrode output terminal 71, and the terminal 73 is extended from the other end of the third conductor in the direction opposite to the positive electrode output terminal 71.

A plurality of input/output terminals 76a and 76b such as gate terminals and the like are connected to the IGBTs 41a and 41b. Further, among the input/output terminals configured to drive the respective IGBTs, an emitter sense terminal is provided at a position other than the position of the IGBT element, i.e., at a position separate from the emitter electrode surface of the IGBT.

In this embodiment, an emitter sense terminal 78a corresponding to the IGBT 41a is formed integral with the AC output terminal 73, and upwardly protrudes from the proximal end part of the AC output terminal. An emitter sense terminal 78b corresponding to the IGBT 41b is formed integral with the negative electrode output terminal 72, and upwardly protrudes from the proximal end part of the negative electrode output terminal.

The first to third conductors 61, 62, and 63, and first and second semiconductor elements are covered with a cover (not shown) formed of a synthetic resin or the like. The cover is fixed to, for example, the radiator plate 67. End parts of the positive electrode output terminal 71, negative electrode output terminal 72, and AC output terminal 73 are provided to be exposed to the outside of the cover.

By the configuration described above, the power semiconductor module 16 for the U-phase is obtained. The power semiconductor module 18 for the V-phase, and power semiconductor module 20 for the W-phase are configured in the same manner as the power semiconductor module 16 for the U-phase described above. That is, as shown in FIG. 12, the power semiconductor module 18 for the V-phase is provided with an IGBT 42a and diode 52a each constituting the upper arm of the V-phase in the inverter circuit, IGBT 42b and diode 52b each constituting the lower arm of the V-phase, first conductor functioning as a DC positive electrode conductor, second conductor functioning as a DC negative electrode conductor, third conductor arranged between the first and second conductors, and functioning as an AC electrode conductor, positive electrode output terminal, negative electrode output terminal, AC output terminal, sheet-like insulator, and radiator plate.

The power semiconductor module 20 for the W-phase is provided with an IGBT 43a and diode 53a each constituting the upper arm of the W-phase in the inverter circuit, IGBT 43b and diode 53b each constituting the lower arm of the W-phase, first conductor functioning as a DC positive electrode conductor, second conductor functioning as a DC negative electrode conductor, third conductor arranged between the first and second conductors, and functioning as an AC electrode conductor, positive electrode output terminal, negative electrode output terminal, AC output terminal, sheet-like insulator, and radiator plate.

The three power semiconductor modules 16, 18, and 20 are arranged side by side on the same plane in a state where the directions of the positive electrode output terminals, negative electrode output terminals, and AC output terminals of the respective power semiconductor modules 16, 18, and 20 coincide with each other. The positive electrode output terminal and negative electrode output terminal of each of the power semiconductor modules 16, 18, and 20 are connected to the capacitor 24 and DC power supply device or battery through connection conductors (not shown). The AC output terminal of each of the power semiconductor modules 16, 18, and 20 is connected to the motor 12 through a three-phase output connection conductor 26.

According to the power semiconductor module of the inverter device configured as described above, among the input/output terminals of the IGBT which is the switching element, the emitter sense terminal is provided at a position other than the position of the IGBT element, e.g., at the proximal end part of the output terminal. As a result of this, a structure is obtained in which a conductor intervenes between the emitter of the switching element and emitter sense terminal, and the switching element includes inductance on the emitter side. As a result of this, even when the configuration in which both the surfaces of the switching element are joined to the conductors is employed, it is possible to prevent a vibration phenomenon of the switching element from occurring.

Figure 16:
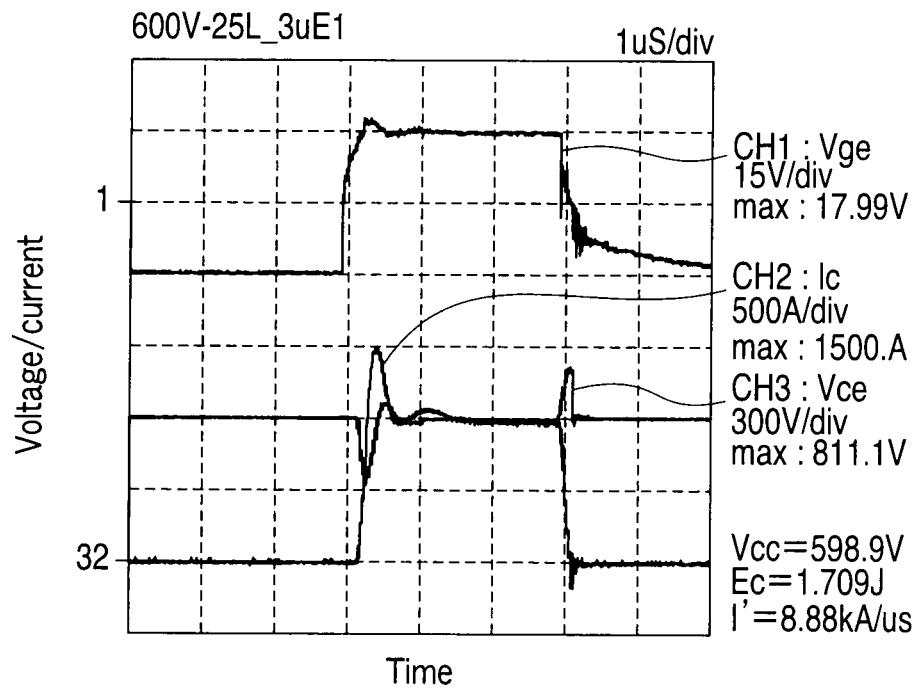
FIG. 16 is a graph showing the current/voltage characteristics of a switching element of the power semiconductor module according to the fourth embodiment.

FIG. 15 shows the current/voltage characteristics of a case where a switching element is driven in a comparative example a configuration in which an emitter sense terminal is provided in the switching element. FIG. 16 shows the current/voltage characteristics of a case where a switching element is driven in the power semiconductor module according to this embodiment. As shown in FIGS. 15 and 16, it can be seen that whereas in the comparative example, the current/voltage oscillates when the switching element is driven, in the power semiconductor module according to this embodiment, oscillation of the current/voltage is largely reduced when the switching element is driven.

As described above, it is possible to obtain a power semiconductor module and inverter device capable of suppressing oscillation of the current/voltage, and supplying a stable output.

Figure 19:
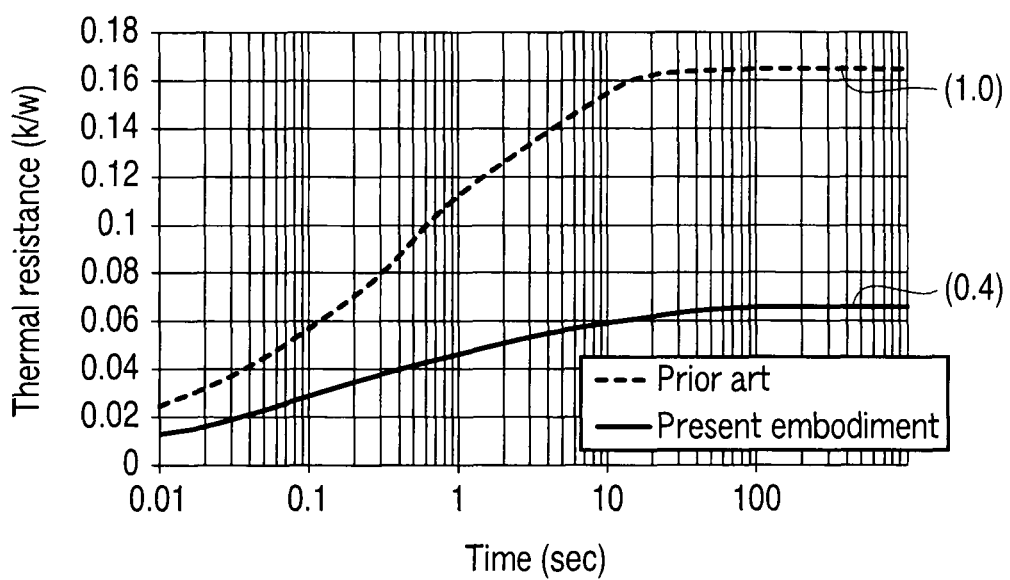
FIG. 19 is a graph showing a result of analysis of the thermal resistance of the power semiconductor module.

Further, according to the power semiconductor module configured as described above, by arranging the semiconductor elements in such a manner that the semiconductor elements are interposed between electrode conductors with large thermal capacity, it is possible to efficiently radiate heat generated from the semiconductor elements through a plurality of electrode conductors. As a result of this, it is possible, as shown in FIG. 19, to reduce the thermal resistance of the semiconductor element by about 60% as compared with the conventional power semiconductor module.

In the power semiconductor module, a plurality of IGBTs in each of which the heat release value is greater than the diode are provided at positions shifted from each other in the direction of the central axis line of the third conductor without being opposed to each other. That is, the IGBTs arranged on both sides of the third conductor are arranged at positions asymmetrical with respect to the central axis line of the third conductor. This makes it possible to prevent the heat from being accumulated in the third conductor, and improve the cooling efficiency.

Figures 17A, 17B:
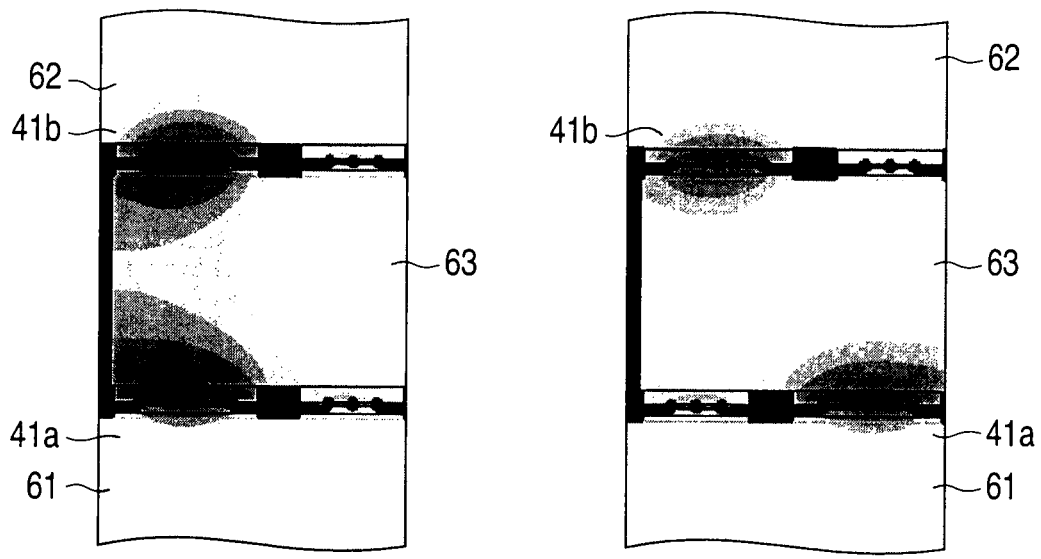
FIG. 17A is a view schematically showing the interference states of heat components in the power semiconductor module according to the comparative example.
FIG. 17B is a view schematically showing the interference states of heat components in the power semiconductor module according to this embodiment.
Figure 18:
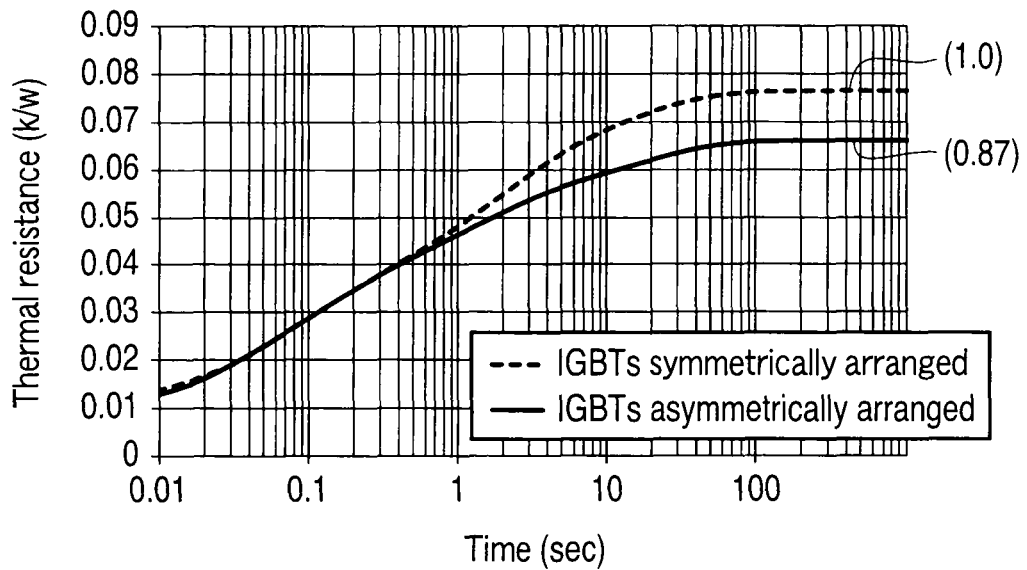
FIG. 18 is a graph showing a result of analysis of the thermal resistance of the semiconductor element.

FIG. 17A shows the configuration in which two IGBTs 41a and 41b are arranged to be opposed each other with the third conductor 63 interposed between them. In this case, the heat components conducted from the IGBT 41a and IGBT 41b interfere each other inside the third conductor. For this reason, heat is liable to be accumulated in the third conductor, and the thermal resistance becomes high. Conversely, according to the configuration in which, as in the case of this embodiment, the IGBTs 41a and 41b arranged on both sides of the third conductor 63 are arranged by shifting them from each other in the direction of the central axis line of the third conductor as shown in FIG. 17B, it is possible, in the third conductor, to reduce the interference between the heat components from the IGBTs 41a and 41b, and prevent the heat from being accumulated. This makes it possible to reduce the thermal resistance of the semiconductor element by about 13% as shown in FIG. 18.

As a result of the above, it is possible to obtain a power semiconductor module, and semiconductor power converter in which the cooling efficiency is improved.

While certain embodiments of the invention have been described, these embodiments have been presented by way of example only, and are not intended to limit the scope of the invention. Indeed, the novel methods and systems described herein may be embodied in a variety of other forms. Furthermore, various omissions, substitutions and changes in the form of the methods and systems described herein may be made without departing from the spirit of the invention. The accompanying claims and their equivalents are intended to cover such forms or modifications as would fall within the scope and spirit of the invention.

In each of the embodiments described above, although an IGBT is used as the switching element, a transistor of another type or thyristor may be used as the switching element. In each of the embodiments, the number of IGBTs and diodes can be increased or decreased as the need arises. The semiconductor element can be appropriately changed in accordance with the purpose or use of the object (for example, electric vehicle) to which the semiconductor power converter is applied, and hence the optimum power capacity and the like can be selected. The semiconductor power converter is not limited to the inverter device configured to convert DC power into three-phase AC power, and can also be applied to an inverter device configured to covert DC power into single-phase AC power. The power semiconductor module is not limited to the above-mentioned two-arm configuration, and multi-arm structure of three or more arms may also be used.

What is claimed is:

1. A power semiconductor module comprising:
a first semiconductor element constituting an upper arm of a first phase in a first circuit of a first system for driving a first electric device;
a second semiconductor element constituting a lower arm of the first phase in the first circuit of the first system;
a third semiconductor element constituting an upper arm of a first phase in a second circuit of a second system for driving a second electric device;
a fourth semiconductor element constituting a lower arm of the first phase in the second circuit of the second system;
a first conductor comprising a first joint surface joined to a positive electrode side of the first semiconductor element, and joined to a positive electrode side of the third semiconductor element;
a second conductor comprising a first joint surface joined to a negative electrode side of the second semiconductor element, and joined to a negative electrode side of the fourth semiconductor element;
a third conductor arranged between the first conductor and the second conductor, and comprising a first joint surface opposed to the first joint surface of the first conductor and joined to a negative electrode side of the first semiconductor element, and a second joint surface opposed to the first joint surface of the second conductor and joined to a positive electrode side of the second semiconductor element; and
a fourth conductor arranged between the first conductor and second conductor, aligned with the third conductor, and comprising a first joint surface opposed to the first joint surface of the first conductor and joined to a negative electrode side of the third semiconductor element, and a second joint surface opposed to the first joint surface of the second conductor and joined to a positive electrode side of the fourth semiconductor element.

2. The power semiconductor module according to claim 1, wherein the third conductor includes a first end opposed to the fourth conductor with a gap, and the fourth conductor includes a first end opposed to the first end of the third conductor, a second end opposite to the first end of the fourth conductor, and a notch extending from the first end to the second end of the fourth conductor, and
which further comprises:
a positive electrode output terminal extending from the first conductor;
a negative electrode output terminal extending from the second conductor;
a first AC output terminal configured to extend from the first end of the third conductor and beyond the second end of the fourth conductor through the notch of the fourth conductor; and
a second AC output terminal configured to extend from the second end of the fourth conductor.

3. The power semiconductor module according to claim 1, wherein the first, second, third, and fourth conductors are each formed into an elongate shape including first and second axial ends, and are arranged in parallel with one another,
the third conductor is arranged between the first and second conductors in parallel with the first and second conductors with a gap between the first and second conductors, and
the fourth conductor is arranged between the first and second conductors in parallel with the first and second conductors with a gap between the first and second conductors, and aligned with the third conductor,
which further comprises:
a positive electrode output terminal extending from the first axial end of the first conductor;
a negative electrode output terminal extending from the first axial end of the second conductor in the same direction as the positive electrode output terminal;
a first AC output terminal extending from the second axial end of the third conductor opposed to the first axial end of the fourth conductor in a direction opposite to the positive electrode output terminal; and
a second AC output terminal extending from the second axial end of the fourth conductor in a direction opposite to the positive electrode output terminal.

4. The power semiconductor module according to claim 1, wherein the third conductor includes an axial end opposed to the fourth conductor with a gap, and the fourth conductor includes a first axial end opposed to the axial end of the third conductor with a gap, and a second axial end opposite to the first axial end of the fourth conductor, and
which further comprises:
a positive electrode output terminal extending from the first conductor;
a negative electrode output terminal extending from the second conductor; and
a first AC output terminal configured to extend from the axial end of the third conductor beyond the second axial end of the fourth conductor and electrically connected to the fourth conductor.

5. The power semiconductor module according to claim 1, further comprising a radiator member including a joint surface joined to the first conductor, second conductor, third conductor, and fourth conductor.

6. The power semiconductor module according to claim 5, wherein a first joint surface between the first and second semiconductor elements and the first conductor, a second joint surface between the second and fourth semiconductor elements and the second conductor, a third joint surface between the first and second semiconductor elements and the third conductor, and a fourth joint surface between the third and fourth semiconductor elements and the fourth conductor each extends to intersect the joint surface of the radiator member.

7. A semiconductor power converter comprising:
the power semiconductor module according to claim 1;
a drive circuit configured to drive the power semiconductor module; and
a control circuit configured to control the power semiconductor module.

8. A power semiconductor module comprising:
a first semiconductor element including a first switching element, and constituting one arm;
a second semiconductor element including a second switching element, and constituting another arm;
a first conductor joined to a positive electrode side of the first semiconductor element;
a second conductor joined to a negative electrode side of the second semiconductor element;
a third conductor arranged between the first conductor and the second conductor, and joined to a negative electrode side of the first semiconductor element and a positive electrode side of the second semiconductor element;
a plurality of input and output terminals provided for the first switching element and second switching element;
a first electrode output terminal extended from the first conductor;
a second electrode output terminal extended from the second conductor;

a third electrode output terminal extended from the third conductor; and emitter sense terminals provided at the first, second, and third electrode output terminals, and configured to drive the first and second switching elements.

9. The power semiconductor module according to claim 8, wherein the first conductor, second conductor, and third conductor are arranged side by side in parallel with one another, the first switching element is interposed between the first conductor and the third conductor, and the second semiconductor element is interposed between the second conductor and third conductor.

10. The power semiconductor module according to claim 8, further comprising a radiator member including a joint surface joined to the first conductor, second conductor, and third conductor.

11. The power semiconductor module according to claim 10, wherein a first joint surface between the first conductor and the first semiconductor element, a second joint surface between the second conductor and the second semiconductor element, a third joint surface between the third conductor and the first semiconductor element, and a fourth joint surface between the third conductor and the second semiconductor element each extends to intersect the joint surface of the radiator member.

12. A semiconductor power converter comprising:

the power semiconductor module according to claim 8;

a drive circuit configured to drive the power semiconductor module; and a control circuit configured to control the power semiconductor module.

13. A power semiconductor module comprising:

a first semiconductor element including a first switching element, and constituting one arm;

a second semiconductor element including a second switching element, and constituting another arm;

a first conductor joined to a positive electrode side of the first semiconductor element;

a second conductor joined to a negative electrode side of the second semiconductor element; and a third conductor arranged between the first conductor and second conductor, and comprising a first joint surface opposed to the first conductor and joined to a negative electrode side of the first semiconductor element, a second joint surface opposed to the second conductor and joined to a positive electrode side of the second semiconductor element, and a central axis parallel to the first and second joint surfaces;

the first switching element and the second switching element being arranged at positions asymmetrical with respect to the central axis of the third conductor, wherein the first conductor, second conductor, and third conductor are arranged side by side in parallel with one another, the first semiconductor element includes the first switching element and a first diode which are interposed between the first conductor and the third conductor, and are arranged in a line along the central axis, the second semiconductor element includes the second switching element and a second diode which are interposed between the second conductor and the third conductor, and are arranged in a line along the central axis, and the first switching element and second switching element are arranged at positions shifted from each other in the direction of the central axis.

14. The power semiconductor module according to claim 13, wherein the first switching element is opposed to the second diode of the second semiconductor element with the third conductor interposed between the first switching element and the second diode, and the second switching element is opposed to the first diode of the first semiconductor element with the third conductor interposed between the second switching element and the first diode.

15. The power semiconductor module according to claim 13, further comprising a radiator member including a joint surface joined to the first conductor, second conductor, and third conductor.

16. The power semiconductor module according to claim 15, wherein the first conductor comprises a first joint surface joined to the first semiconductor element, the second conductor comprises a first joint surface joined to the second semiconductor element, and the first joint surface of the first and second conductors and the first and second joint surface of the third conductor each extends to intersect the joint surface of the radiator member.

17. A semiconductor power converter comprising:

the power semiconductor module according to claim 13;

a drive circuit configured to drive the power semiconductor module; and a control circuit configured to control the power semiconductor module.

* * * * *